(12) United States Patent
Taniguchi et al.

(10) Patent No.: US 11,706,065 B2
(45) Date of Patent: Jul. 18, 2023

(54) SYMBOL JUDGEMENT APPARATUS AND SYMBOL JUDGEMENT METHOD

(71) Applicant: NIPPON TELEGRAPH AND TELEPHONE CORPORATION, Tokyo (JP)

(72) Inventors: Hiroki Taniguchi, Musashino (JP); Masanori Nakamura, Musashino (JP); Shuto Yamamoto, Musashino (JP); Akira Masuda, Musashino (JP); Yoshiaki Kisaka, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 40 days.

(21) Appl. No.: 17/594,926

(22) PCT Filed: May 8, 2020

(86) PCT No.: PCT/JP2020/018625
§ 371 (c)(1),
(2) Date: Nov. 4, 2021

(87) PCT Pub. No.: WO2020/226172
PCT Pub. Date: Nov. 12, 2020

(65) Prior Publication Data
US 2022/0224575 A1 Jul. 14, 2022

(30) Foreign Application Priority Data
May 8, 2019 (JP) .................................. 2019-088531

(51) Int. Cl.
*H04L 27/01* (2006.01)
(52) U.S. Cl.
CPC .................................. *H04L 27/01* (2013.01)

(58) Field of Classification Search
CPC . H04L 27/01; H04L 25/0202; H04L 25/0212; H04L 25/022; H04L 25/025;
(Continued)

(56) References Cited

U.S. PATENT DOCUMENTS 6,504,868 B1 1/2003 Koizumi
7,372,923 B2 * 5/2008 Becker ................ H04L 25/0328
375/229

(Continued)

FOREIGN PATENT DOCUMENTS

JP H11-261452 A 9/1999
JP 2009-225005 A 10/2009

OTHER PUBLICATIONS

D. D. Falconer and F. R. Magee, Jr. "Adaptive Channel Memory Truncation for Maximum Likelihood Sequence Estimation", The Bell System Technical Journal vol. 52, No. 9, pp. 1541-1562 Nov. 1973.

(Continued)

*Primary Examiner* — Freshteh N Aghdam
(74) *Attorney, Agent, or Firm* — Harness, Dickey & Pierce, P.L.C.

(57) ABSTRACT

A device generates a symbol sequence by performing adaptive equalization by an estimation inverse transfer function of a transmission line on a reception signal sequence extracted from the transmission line, and performing provisional determination on the symbol sequence generated; generates a plurality of the symbol sequences indicating transmission line states in a range of a provisional determination symbol provisionally determined and nearby symbols of the provisional determination symbol; generates, based on the plurality of the symbol sequences indicating the transmission line states generated and an estimation transfer function of the transmission line, an estimation reception symbol sequence for each of the transmission line states;

(Continued)

calculates a metric between the symbol sequence obtained from the reception signal sequence and each of a plurality of the estimation reception symbol sequences; selects a most likelihood estimation reception symbol sequence of the plurality of the estimation reception symbol sequences, based on the calculated metric, the provisional determination symbol, and the nearby symbols of the provisional determination symbol; and determines a transmission symbol sequence.

8 Claims, 19 Drawing Sheets

(58) Field of Classification Search
CPC ........... H04L 25/0256; H04L 25/03178; H04L 25/03184; H04L 25/03203; H04L 25/03216; H04L 25/03222; H04L 25/03229; H04L 25/03235; H04L 25/03267; H04L 25/03286; H04L 25/03292; H04L 25/03318; H04L 25/03324
See application file for complete search history.

(56) References Cited

U.S. PATENT DOCUMENTS

| | | | | |
|---|---|---|---|---|
| 9,363,110 | B2* | 6/2016 | Zhang | H04L 25/03057 |
| 2002/0037059 | A1* | 3/2002 | Heegard | H04L 1/0054 |
| | | | | 375/265 |
| 2002/0060604 | A1* | 5/2002 | Hammes | H04L 27/2332 |
| | | | | 329/300 |
| 2006/0023814 | A1* | 2/2006 | Varma | H03M 13/6502 |
| | | | | 375/336 |
| 2007/0263715 | A1* | 11/2007 | Kim | H04L 25/03057 |
| | | | | 375/233 |
| 2009/0235060 | A1 | 9/2009 | Yokokawa et al. | |

OTHER PUBLICATIONS

Qiang Zhang, Nebojsa Stojanovic, Liang Zhang, Tianjian Zuo, Changsong Xie, Enbo Zhou, "Up to 190 Gb/s OOK Signal Generation using a Coding and Cutting Technique with a 92 GSa/s DAC", OFC 2017, Th3D.1.

* cited by examiner

| PROVISIONAL DETERMINATION SYMBOL VALUE | TARGET SYMBOL SEQUENCE | BINARY VALUE POSITION |
|---|---|---|
| 「0」 | 「7」、「0」、「1」 | 2ND |
| 「1」 | 「0」、「1」、「2」 | 1ST |
| 「2」 | 「1」、「2」、「3」 | 1ST |
| 「3」 | 「2」、「3」、「4」 | 2ND |
| 「4」 | 「3」、「4」、「5」 | 2ND |
| 「5」 | 「4」、「5」、「6」 | 1ST |
| 「6」 | 「5」、「6」、「7」 | 1ST |
| 「7」 | 「6」、「7」、「0」 | 2ND |

Fig. 14

SYMBOL JUDGEMENT APPARATUS AND SYMBOL JUDGEMENT METHOD

CROSS-REFERENCE TO RELATED APPLICATIONS

This application is a 371 U.S. National Phase of International Application No. PCT/JP2020/018625 filed on May 8, 2020, which claims priority to Japan Patent Application No. 2019-088531, filed on May 8, 2019. The entire disclosure of the above applications are incorporated herein by reference.

TECHNICAL FIELD

The present invention relates to a symbol determination device and a symbol determination method.

BACKGROUND ART

The traffic transferred by backbone networks of the Internet continues to increase by the recent rapid spread of smartphones and tablets, and increases in rich contents, such as high definition video distribution services. The utilization of cloud services in enterprises is also increasing. From these trends, it is expected that network traffic in data centers (hereinafter referred to as "DCs") and between DCs is increasing at an annual rate of approximately 1.3 times.

The Ethernet (trade name) is currently, mainly introduced to a connection scheme in DCs and between DCs. Due to communication traffic increase, it is expected that the scale enlargement of DC at a single site becomes difficult. Thus, the need for DC-to-DC cooperation will be higher than before in the future, and an additional increase in traffic transmitted and received between DCs is expected. To accommodate such situations, the establishment of low cost and high capacity short-distance optical transmission technologies is required.

In the current Ethernet (trade name) standard, optical fiber communication is applied to a transmission line up to 40 km except for 10 Gigabit Ethernet (GbE: trade name)-ZR. An intensity modulation scheme that assigns binary information to on and off of light is used up to 100 GbE. The receiving side is constituted only by a light receiver, and is configured to be less expensive than a coherent reception scheme used for long-distance transmission.

In 100 GbE, transmission capacity of 100 Gb/s is achieved by multiplexing four waves of Non-return-to-zero (NRZ) signals with modulation speed of 25 GigaBaud (GBd), and an amount of information per symbol of 1 bit/symbol.

In standardization of 400 GbE, which is the next generation of 100 GbE, 4-level pulse-amplitude-modulation (PAM4) with 2 bits/symbol is first employed in consideration of maintenance of economical device configurations used in 100 GbE and the bandwidth utilization efficiency of the signals. Thus, in 400 GbE, the transmission capacity of 400 Gb/s is achieved by multiplexing eight waves of 50 Gb/s signals. Examples of 400 GbE standards include 400GBASE-FR8 and LR8.

Standardization of 800 GbE, 1.6 TbE is scheduled after 2020 for future additional traffic increase. These communication speeds are planned to be achieved by, for example, multiplexing four to eight wavelengths of signals with the modulation speed of 100 GBaud by using 200 Gb/s PAM4, or achieved by multiplexing four to eight wavelengths of signals with the modulation speed of 75 GBaud using 200 Gb/s PAM8, as illustrated in FIG. 15.

As a challenge for further capacity enlargement, signal quality degradation associated with increase in the transmission capacity, that is, the impact of device band restrictions and wavelength dispersion becomes obvious. For example, as illustrated in FIG. 16, when the transmission capacity increases and the used band thus increases, there is a problem that the frequency region 501 (hatched region of diagonal lines) is lost due to the device band restrictions. As illustrated in FIG. 17, when the transmission capacity increases, the impact of wavelength dispersion increases, and the interfering region 502 increases.

An approach to solve such problems is an approach to use a Digital to Analog Converter (DAC) or an Analog to Digital Converter (ADC) support a high speed communication speed, or to use a dispersion compensation module that compensates for dispersion of wavelengths, and the like. However, such devices are expensive and the cost required for the device increases, and thus, from an economical point of view, this approach is preferably avoided. From an economical point of view, a desired approach is an approach that maintains a configuration of a conventional transceiver and utilizes low cost narrow band devices while being multivalued and improving band restriction proof stress and wavelength dispersion proof stress. However, in a case of using low cost narrow band devices, problems caused by band restrictions, inter-symbol interference due to wavelength dispersion, and the like associated with increase of communication speed as described above need to be solved.

As the most effective equalization scheme for obtaining correct transmission data from reception signal waveforms that are distorted due to problems such as inter-symbol interference, the Maximum Likelihood Sequential Estimation (hereinafter referred to as "MLSE") is known (for example, see NPDs 1 and 2).

For example, FIG. 18 is a block diagram illustrating a conventional communication system 100 configured by using the aforementioned low cost narrow band device. The communication system 100 includes a transmission side signal generation device 1, a transmission line 2, and a reception side symbol determination device 90. The signal generation device 1 takes in an m-valued data signal provided from the outside and generates a transmission signal sequence $\{s_t\}$ of an electrical signal. Here, m is the symbol multi-level degree, and is an integer of 2 or greater. t is an identification number for identifying the transmission signal sequence, and in a case where the number of symbols included in a transmission signal sequence $\{s_t\}$ is N, integer values such as 1, 2, 3, . . . , N are allocated.

An intensity modulator 2-2 of the transmission line 2 takes in the transmission signal sequence $\{s_t\}$ of the electrical signal output by the signal generation device 1, modulates light emitted by a light source 2-1 with the transmission signal sequence $\{s_t\}$ of the electrical signal taken in, and generates a transmission signal sequence $\{s_t\}$ of an optical signal. An optical fiber 2-3 transmits the transmission signal sequence $\{s_t\}$ of the optical signal generated by the intensity modulator 2-2. A light receiver 2-4 receives the transmission signal sequence $\{s_t\}$ of the optical signal transmitted by the optical fiber 2-3 as a reception signal sequence $\{r_t\}$ of the optical signal, and converts into the reception signal sequence $\{r_t\}$ of the electrical signal to output.

At this time, when the transmission line 2 is illustrated as an equalization circuit, the configuration is illustrated in FIG. 19. In FIG. 19, delay units 82-1 to 82-2L take in and store input symbols, and outputs the stored input symbols after a time period of "T" has elapsed. Here, "T" is the symbol interval, and the timing of the computation for each symbol is "tT".

A delay unit 81 takes in and stores the input symbols, and outputs the stored input symbols after a time period of "−LT" has elapsed. Note that a delay amount is negatively signed, which means that the delay unit 81 gives a negative delay of "LT". Here, in the transmission line 2, L symbols before and after the element $s_t$ in the transmission signal sequence $\{s_t\}$ of the optical signal are given to a transfer function unit 83 by the delay unit 81 by assuming that the inter-symbol interference of L symbols before and after the symbol at the time t occurs.

The transfer function unit 83 applies a transfer function (H) to the symbol sequence output by the delay units 81, and 82-1 to 82-2L. An adder 85 adds a noise component $\omega_t$ to an output value of the transfer function unit 83 to generate a reception signal sequence $\{r_t\}$. $\omega_t$ is a Gaussian random sequence that is independent of each other on average 0 and variance $\delta^2$.

The reception signal sequence $\{r_t\}$ generated by the equalization circuit of FIG. 19 is expressed by Equation (1) below. In Equation (1), t=1, 2, . . . , N.

[Math. 1]

$$r_t = H(s_{t-L}, \ldots, s_t, \ldots, s_{t+L}) + \omega_t \quad (1)$$

FIG. 20 is a diagram illustrating an internal configuration of the symbol determination device 90, which is an identification circuit for identifying the transmission symbol sequence by the MLSE on the basis of the reception signal sequence $\{r_t\}$ output by the transmission line 2. The transfer function (H) in the transmission line 2 is an unknown function. Thus, the symbol determination device 90 estimates the transfer function (H) of the transmission line 2, and generates a replica of the reception symbol sequence by using the estimated transfer function (H') (hereinafter referred to as the "estimation transfer function (H')"). Hereinafter, the reception symbol sequence replicated by the estimation transfer function (H') is referred to as an estimation reception symbol sequence. The symbol determination device 90 compares the generated estimation reception symbol sequence with a symbol sequence obtained from the reception signal sequence $\{r_t\}$, and determines a most likelihood estimation reception symbol sequence as a determination result.

In MLSE, the symbol determination is performed by searching for a transmission signal sequence $\{s'_t\}$ that maximizes the conditional joint-probability density function $p_N (\{r_N\} \{s'_N\})$. The conditional joint-probability density function $p_N (\{r_N\} \{s'_N\})$ is a probability of receiving a reception signal sequence $\{r_t\}$ in a case where a transmission signal sequence $\{s'_t\}$ of a sequence length N generated from the m-valued data is transmitted through the transmission line 2, and is expressed by Equation (2) below.

[Math. 2]

$$p_N(\{r_N\} \mid \{s'_N\}) = \frac{1}{(2\pi\delta^2)^N} \exp\left[-\frac{1}{2\delta^2} \sum_{t=1}^{N} |r_t - H(s'_{t-L}, \ldots, s'_t, \ldots, s'_{t+L})|^2\right] \quad (2)$$

Maximizing the conditional joint-probability density function $p_N (\{r_N\} \{s'_N\})$ is equivalent to minimizing a distance function $d_N$ indicated by Equation (3). Note that in Equation (3), (p−1)/2=L.

[Math. 3]

$$d_N = \sum_{t=1}^{N} |r_t - H'(s'_{t-(p-1)/2}, \ldots, s'_t, \ldots, s'_{t+(p-1)/2})|^2 \quad (3)$$

In Equation (3), $(s'_{t-(p-1)/2}, \ldots, s'_t, \ldots, s'_{t+(p-1)/2})$ indicates a state $\mu_t$ of the transmission line 2 at the time t (hereinafter referred to as a "transmission line state $\mu_t$"). In a case where the symbol sequence length is "p", the number of all combinations of the modulation symbols I=[$i_1, i_2, \ldots i_m$] is "$m^p$". In this case, the transmission line 2 can be considered a finite state machine with $m^p$ finite transmission line states. Because the transmission line 2 can be considered a finite state machine, the distance function $d_N$ can be calculated by performing successive calculations for each reception signal sequence $\{r_t\}$ by using a maximum likelihood sequence estimation technique such as, for example, a Viterbi algorithm.

At the time t, the distance function $d_t (\{\mu_t\})$ that reaches the transmission line state $\mu_t$ is expressed by Equation (4) below by using a distance function $d_{t-1} (\{\mu_{t-1}\})$ at time t−1 and the likelihood associated with a state transition at the time t, that is, a metric b $(r_t; \mu_{t-1} \rightarrow \mu_t)$.

[Math. 4]

$$d_t(\{\mu_t\}) = d_{t-1}(\{\mu_{t-1}\}) + b(r_t; \mu_{t-1} \rightarrow \mu_t) \quad (4)$$

The metric b $(r_t; \mu_{t-1} \rightarrow \mu_t)$ is expressed as Equation (5) below by using the estimation transfer function (H').

[Math. 5]

$$b(r_t; \mu_{t-1} \rightarrow \mu_t) = |r_t - H'(s'_{t-(p-1)/2}, \ldots, s'_t, \ldots, s'_{t+(p-1)/2})|^2 \quad (5)$$

The metric b at the time t depends only on the state transition from t−1 to t and does not depend on even previous state transitions. Here, it is assumed that the minimum value of the distance function d_min$_{t-1}$ $(\mu_{t-1})$ that reaches the transmission line state $\mu_t$, and the all state transitions corresponding to this are known in all transmission line states $\mu_{t-1}$ at time t−1.

Under this assumption, in a case where the minimum value of the distance function $d_t (\{\mu_t\})$ reaching the transmission line state $\mu_t$ is calculated, it is not necessary to calculate the distance function $d_t (\{\mu t\})$ corresponding to all state transitions. For all transmission line conditions $\{\mu_{t-1}\}$ that have possibility to transition to the transmission line state $\mu_t$, d_min$_{t-1}$ $(\mu_{t-1})$+b $(r_t; \mu_{t-1} \rightarrow \mu_t)$ is calculated, and the minimum value therein is determined to be d_min$_t$ $(\mu_t)$, which is the minimum value of all distance functions $d_t$ $(\{\mu_t\})$ reaching the transmission line state $\mu_t$. This is indicated by Equation (6) below.

[Math. 6]

$$\text{d\_min}_t(\mu_t) = \min_{\{\mu_{t-1}\} \rightarrow \mu_t} \{\text{d\_min}_{t-1}\{\mu_{t-1}\} + b(r_t; \mu_{t-1} \rightarrow \mu_t)\} \quad (6)$$

Returning to FIG. 20, in the symbol determination device 90, the delay units 92-1 to 92-(p−1) takes in and stores the input symbols, and outputs the stored input symbols after a time period of "T" has elapsed. Thus, an estimation transfer function unit 93 is given the symbol sequence of $(s'_{t-(p-1)/2}, \ldots, s'_t, \ldots, s'_{t+(p-1)/2})$ indicating the transmission line state $\mu_t$ at the time t of the transmission line 2. In the estimation transfer function unit 93, the estimation transfer function (H') is applied to the symbol sequence. A subtracter 94 subtracts an output value of the estimation transfer function unit 93 from the reception signal sequence $\{r_t\}$. An absolute value unit 95 calculates an absolute value of an output value of the subtracter 94, and the calculated absolute value is a metric b indicated by Equation (5).

An addition comparison selection unit 91 calculates d_min$_{t-1}$ ($\mu_{t-1}$)+b ($r_t$; $\mu_{t-1} \rightarrow \mu_t$) in Equation (6) for all transmission line states $\{\mu_{t-1}\}$ that have possibility to transition to the transmission line state $\mu_t$, and sets the minimum value among the calculated values as d_min$_t$ ($\mu_t$), which is the minimum value of the distance function $d_t$ ($\{\mu_t\}$).

Based on the minimum value of the distance function $d_t$ ($\{\mu_t\}$) calculated by the addition comparison selection unit 91, a path tracing determination unit 96 traces back the path of the trellis of the Viterbi algorithm, determines an estimation value of the m-valued data taken in by the signal generation device 1, and outputs the determined estimation value as a determination result.

As described above, in the Viterbi algorithm, in a case of calculating a minimum value of a distance function $d_t$ ($\{\mu_t\}$) reaching the transmission line state $\mu_t$, without calculating distance functions $d_t$ ($\{\mu_t\}$) corresponding to all state transitions, d_min$_{t-1}$ ($\mu_{t-1}$)+b ($r_t$; $\mu_{t-1} \rightarrow \mu_t$) is calculated for all transmission line conditions $\{\mu_{t-1}\}$ that have possibility to transition to the transmission line state $\mu_t$. As a result, in the Viterbi algorithm, the amount of computation that increases exponentially with respect to the sequence length can be suppressed to a linear increase. Thus, by using the Viterbi algorithm enables estimation of a maximum likelihood sequence with a reduced amount of computation in the MLSE.

In the MLSE, the inter-symbol interference received by the transmission signal waveform is estimated and reproduced by digital signal processing on the receiver side to achieve high equalization performance. Thus, the higher the estimation accuracy is, the more the symbol errors due to inter-symbol interference are suppressed, and it is possible to obtain correct transmission data from the reception signal waveform distorted by the inter-symbol interference. Signal quality degradation suppression techniques using MLSE have also been studied for the above described capacity enlargement of Ethernet (trade name).

CITATION LIST

Non Patent Document

NPD 1: D. D. FALCONER and F. R. MAGEE, JR. "Adaptive Channel Memory Truncation for Maximum Likelihood Sequence Estimation", The Bell System Technical Journal Vol. 52, No. 9, pp. 1541-1562, November, 1973.
NPD 2: Qiang Zhang, Nebojsa Stojanovic, Liang Zhang, Tianjian Zuo, Changsong Xie, Enbo Zhou, "Up to 190-Gb/s OOK Signal Generation using a Coding and Cutting Technique with a 92 GSa/s DAC", OFC2017, Th3D.1.

SUMMARY OF THE INVENTION

Technical Problem

As described above, in the Viterbi algorithm, computation as indicated by Equation (6) above is performed. If the combinations of the computation targets of Equation (6) is illustrated by a trellis diagram, with a storage length (constraint length) being "3", a combination as illustrated in FIG. 21 is obtained. For example, in a case of the top branch, [i$_1$, i$_1$, i$_1$] corresponds to $(s'_{t-(p-1)/2}, \ldots, s'_t, \ldots, s'_{t+(p-1)/2})$ in Equation (5). As illustrated in FIG. 21, there are m branches from each of m$^2$ transmission line states $\mu_t$, resulting in m$^3$ branches.

For example, in a case where m=8 with the storage length "3", as illustrated in FIG. 22, the number of transmission line states $\mu_t$ is "64" and the number of branches is "512". In the Viterbi algorithm, a computation of a metric needs to be performed for each transmission line state μt, that is, for each branch of the trellis. Thus, there is a problem in that, if a value of m, that is, the symbol multi-level degree increases and the number of states increases, the number of branches of the trellis increases and the amount of computation of the Viterbi algorithm increases.

In light of the foregoing, an object of the present invention is to provide a technique capable of suppressing an increase in the amount of computation even in a case where the symbol multi-level degree increases when performing a determination of a transmission symbol from a reception signal sequence.

Means for Solving the Problem

An aspect of the present invention is a symbol determination device including: a provisional determination unit configured to generate a symbol sequence by performing adaptive equalization by an estimation inverse transfer function of a transmission line on a reception signal sequence extracted from the transmission line, and perform provisional determination on the symbol sequence; a transmission line estimation unit configured to generate, based on a plurality of the symbol sequences indicating the transmission line states and an estimation transfer function of the transmission line, an estimation reception symbol sequence for each of the transmission line states; a sequence estimation algorithm processing unit configured to calculate a metric between the symbol sequence obtained from the reception signal sequence and each of a plurality of the estimation reception symbol sequences, and select a most likelihood estimation reception symbol sequence of the plurality of the estimation reception symbol sequences by a predetermined algorithm, based on the calculated metric, a provisional determination symbol provisionally determined by the provisional determination unit, and nearby symbols of the provisional determination symbol; and a path tracing determination unit configured to determine a transmission symbol sequence by tracing back paths of trellis, based on the most likelihood estimation reception symbol sequence, wherein the sequence estimation algorithm processing unit generates a plurality of the symbol sequences indicating the transmission line states in a range of the provisional determination symbol and nearby symbols of the provisional determination symbol to output the plurality of the symbol sequences to the transmission line estimation unit.

An aspect of the present invention is the symbol determination device described above, wherein the nearby symbols are symbols before and after the provisional determination symbol, and a sum of the number of the provisional determination symbol and the number of the nearby symbols is (2n+1) (n is an integer of 2 or greater).

An aspect of the present invention is the symbol determination device described above, wherein the symbol sequence obtained from the reception signal sequence is any of a symbol sequence included in the reception signal sequence, a symbol sequence generated by the provisional determination unit performing adaptive equalization on a part of the reception signal sequence by the estimation inverse transfer function, or a symbol sequence generated by an adaptive filter unit further included, and the adaptive filter unit generates the symbol sequence by performing filtering processing that compresses a pulse width on a part of an input signal sequence, and is provided with the reception signal sequence or a signal sequence including a symbol sequence generated by the provisional determination unit performing the adaptive equalization on the part of the reception signal sequence by the estimation inverse transfer function of the transmission line, as the input signal sequence.

An aspect of the present invention is the symbol determination device described above, including: an update processing unit configured to calculate the estimation transfer function, based on the symbol sequence output by the path tracing determination unit and the symbol sequence obtained from the reception signal sequence.

An aspect of the present invention is the symbol determination device described above, including: an update processing unit configured to calculate, based on the symbol sequence output by the path tracing determination unit and the symbol sequence obtained from the reception signal sequence, the estimation transfer function and a filter coefficient value of the filtering processing performed by the adaptive filter unit, in a case where the adaptive filter is provided.

An aspect of the present invention is the symbol determination device described above, wherein the predetermined estimation algorithm is a Viterbi algorithm or a BCJR algorithm, and in a case where the BCJR algorithm is applied, the sequence estimation algorithm processing unit uses a finite value defined in advance as a log-likelihood ratio of a binary value in a case where the log-likelihood ratio of the binary value included in the symbol sequence including the provisional determination symbol and the nearby symbols of the provisional determination symbol is infinity.

An aspect of the present invention is the symbol determination device described above, wherein the provisional determination unit calculates the estimation inverse transfer function, based on the symbol sequence generated by performing the adaptive equalization by the inverse transfer function of the transmission line and the symbol sequence obtained as a determination result of the provisional determination.

An aspect of the present invention is a symbol determination method including: generating a symbol sequence by performing adaptive equalization by an estimation inverse transfer function of a transmission line on a reception signal sequence extracted from the transmission line, and performing provisional determination on the symbol sequence; generating a plurality of the symbol sequences indicating transmission line states in a range of a provisional determination symbol provisionally determined and nearby symbols of the provisional determination symbol; generating, based on the plurality of the symbol sequences generated and an estimation transfer function of the transmission line, an estimation reception symbol sequence for each of the transmission line states; calculating a metric between the symbol sequence obtained from the reception signal sequence and each of a plurality of the estimation reception symbol sequences; selecting a most likelihood estimation reception symbol sequence of the plurality of the estimation reception symbol sequences by a predetermined algorithm, based on the calculated metric, the provisional determination symbol, and the nearby symbols of the provisional determination symbol; and determining a transmission symbol sequence by tracing back paths of trellis, based on the most likelihood estimation reception symbol sequence.

Effects of the Invention

According to the present invention, an increase in the amount of computation can be suppressed even in a case where the symbol multi-level degree increases when performing a determination of a transmission symbol from a reception signal sequence.

BRIEF DESCRIPTION OF DRAWINGS

FIG. 14 is a diagram illustrating an example of a table included in a symbol determination device in a case of applying the BCJR algorithm.

DESCRIPTION OF EMBODIMENTS

First Embodiment

Figure 1:
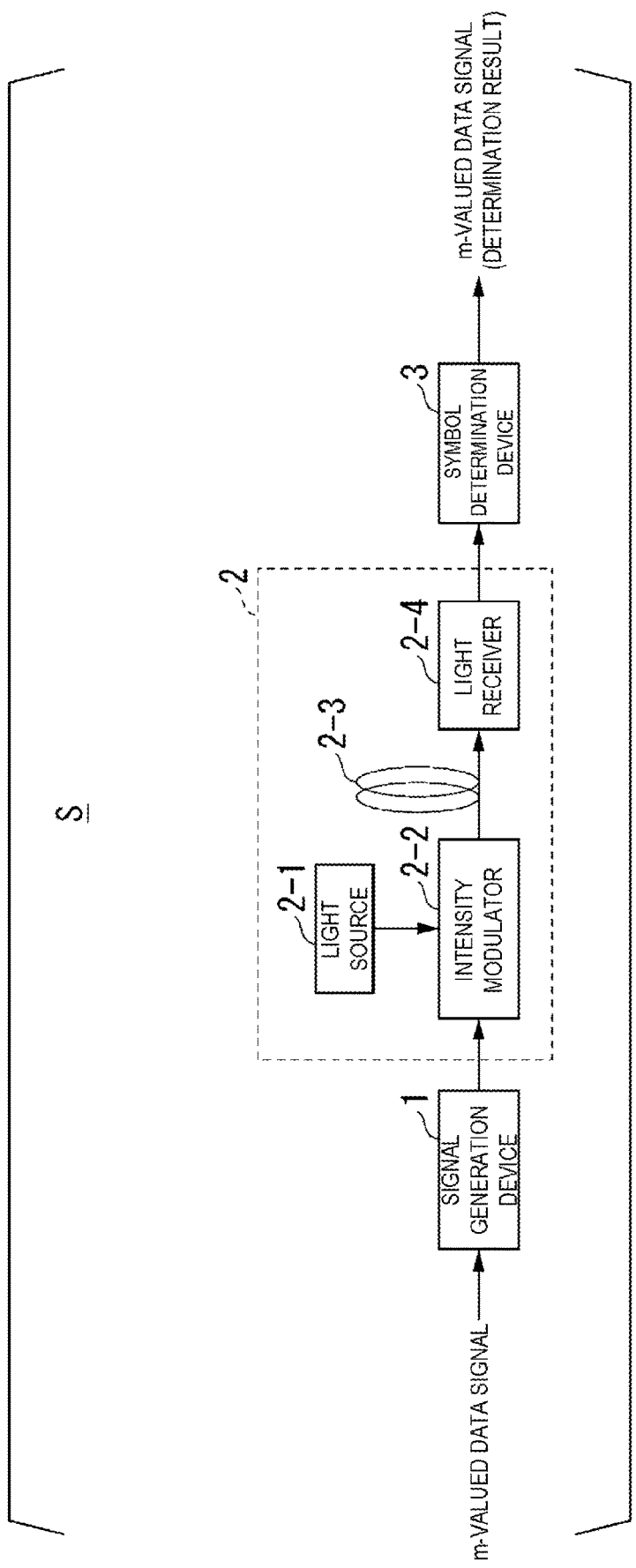
FIG. 1 is a block diagram illustrating a configuration of a communication system according to a first embodiment.

Embodiments of the present invention will be described below with reference to the drawings. FIG. 1 is a block diagram illustrating a configuration of a communication system S according to a first embodiment. The communication system S includes a signal generation device 1, a transmission line 2, and a symbol determination device (symbol judgement apparatus) 3.

Figure 18:
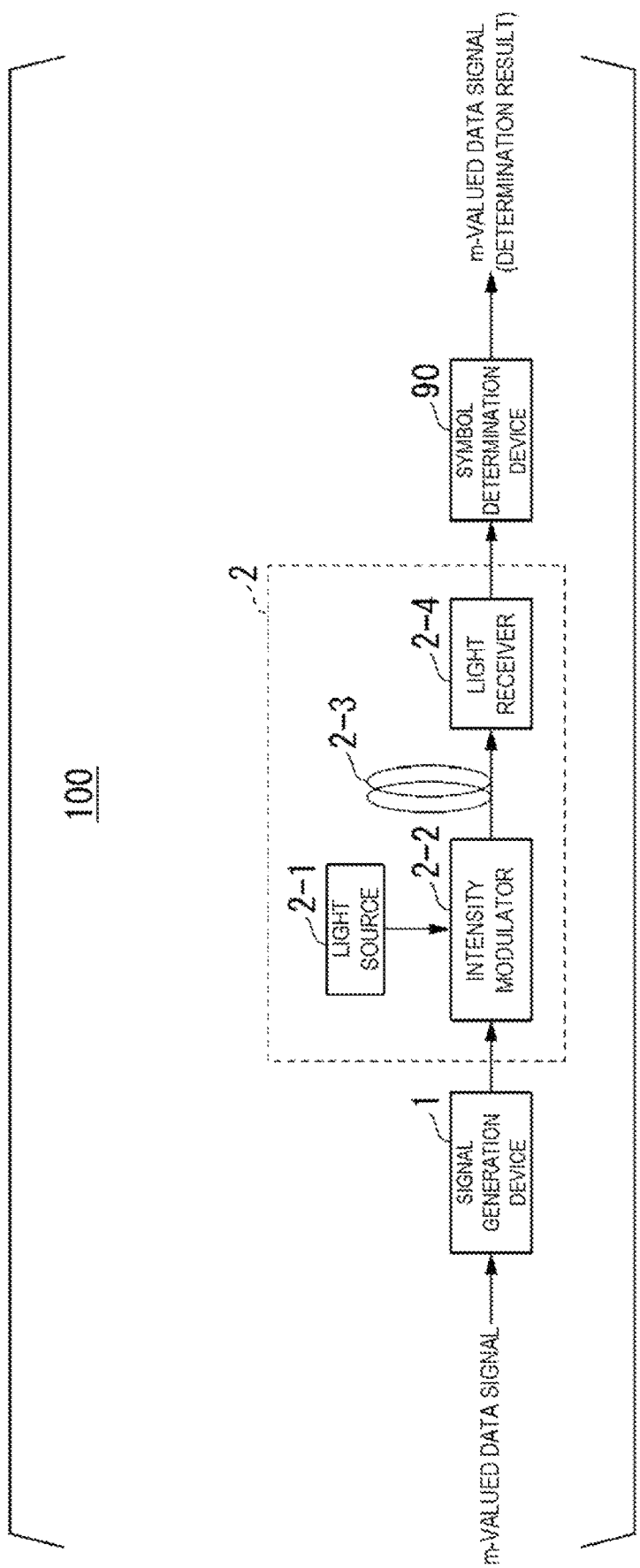
FIG. 18 is a block diagram illustrating a configuration of a conventional communication system.
Figure 19:
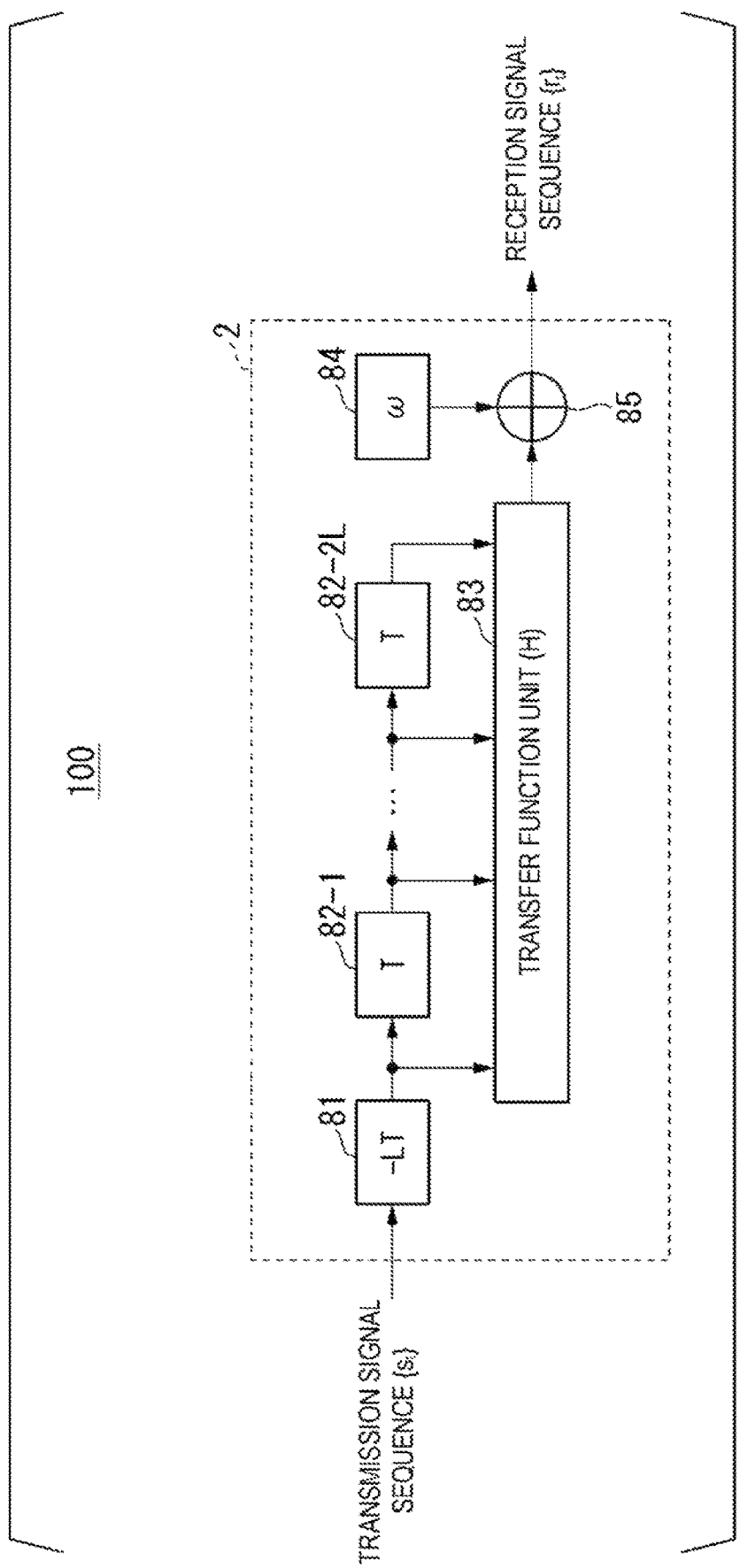
FIG. 19 is a block diagram of an equalization circuit of a transmission line.
Figure 20:
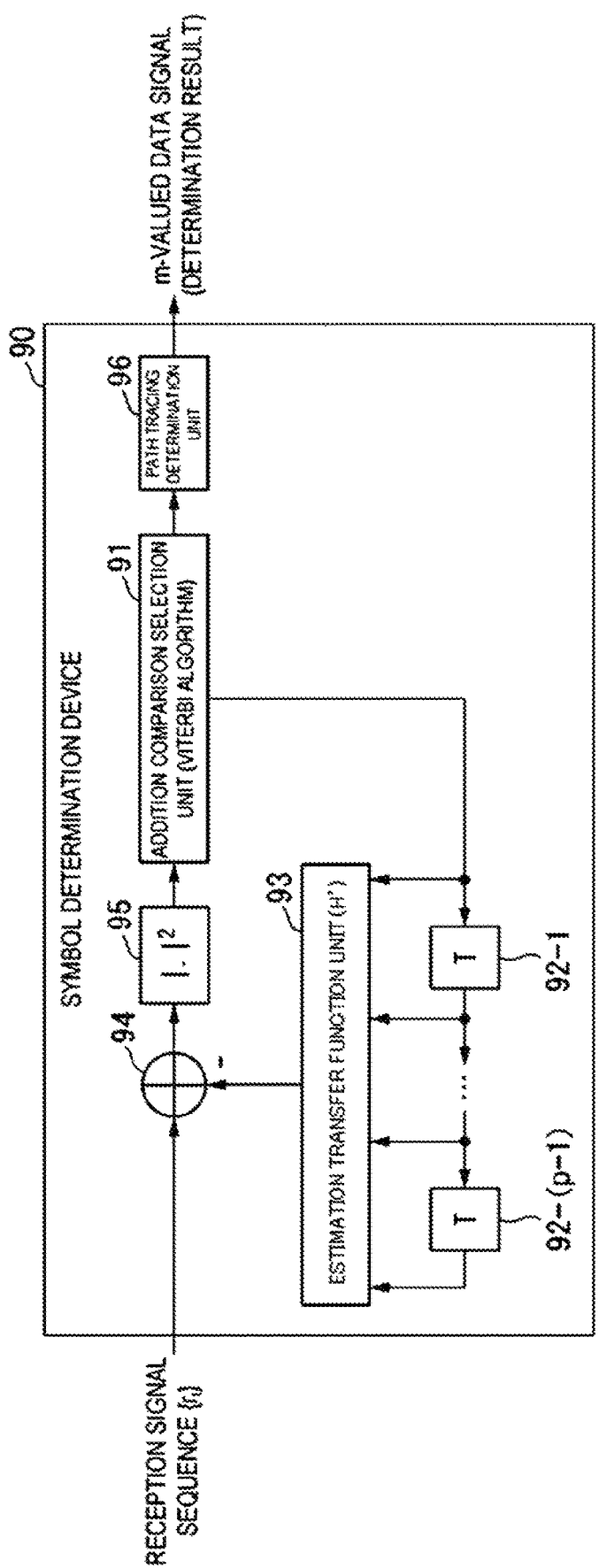
FIG. 20 is a block diagram illustrating an internal configuration of a conventional symbol determination device.
Figure 21:
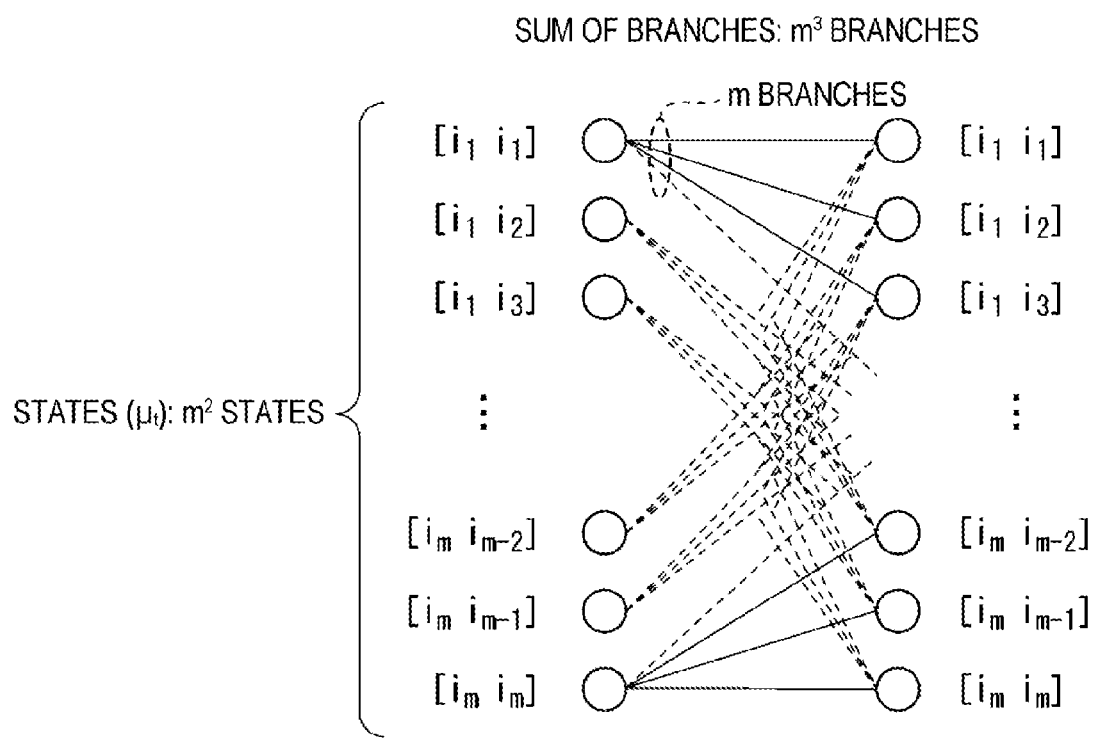
FIG. 21 is a trellis diagram illustrating the states to be computed in the Viterbi algorithm.
Figure 22:
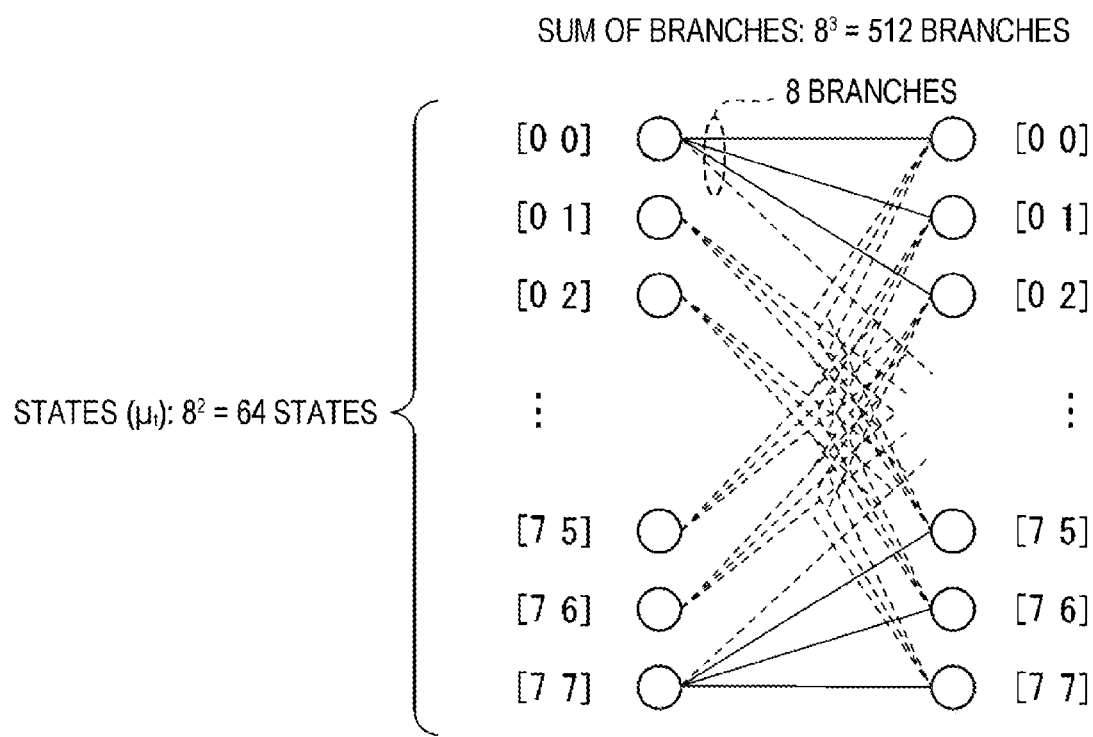
FIG. 22 is a trellis diagram in a case where the symbol multi-level degree is 8 in FIG. 21.

The signal generation device 1 and the transmission line 2 have the same configurations as the signal generation device 1 and the transmission line 2 provided in the conventional communication system 100 illustrated in FIG. 18. The signal generation device 1 takes in an m-valued data signal provided from the outside. m is the symbol multi-level degree, for example, an integer of 2 or greater. Each symbol is represented by numbers and symbols. For example, in the case of m=8, respective symbols are represented by the number [0, 1, 2, 3, 4, 5, 6, 7]. The signal generation device 1 generates a transmission signal sequence $\{s_t\}$ of an electrical signal including a transmission symbol sequence, with the m-valued data signal taken in as the transmission symbol sequence. t is an identification number identifying the transmission signal sequence. In a case where the number of symbols included in the transmission signal sequence $\{s_t\}$ is N, integer values such as t=1, 2, 3, . . . , N are allocated.

In the transmission line 2, an intensity modulator 2-2 takes in the transmission signal sequence $\{s_t\}$ of the electrical signal output by the signal generation device 1. The intensity modulator 2-2 modulates light emitted by a light source 2-1 based on the symbol sequence of the m value included in the transmission signal sequence $\{s_t\}$ of the electrical signal. In this way, the intensity modulator 2-2 generates a transmission signal sequence $\{s_t\}$ of the optical signal representing the symbol sequence of the m value.

An optical fiber 2-3 transmits the transmission signal sequence $\{s_t\}$ of the optical signal generated by the intensity modulator 2-2.

A light receiver 2-4 receives the transmission signal sequence $\{s_t\}$ of the optical signal transmitted by the optical fiber 2-3 as a reception signal sequence $\{r_t\}$ of an optical signal. The light receiver 2-4 converts the reception signal sequence $\{r_t\}$ of the received optical signal into a reception signal sequence $\{r_t\}$ of an electrical signal to output. The light receiver 2-4 is, for example, a photodiode.

Figure 2:
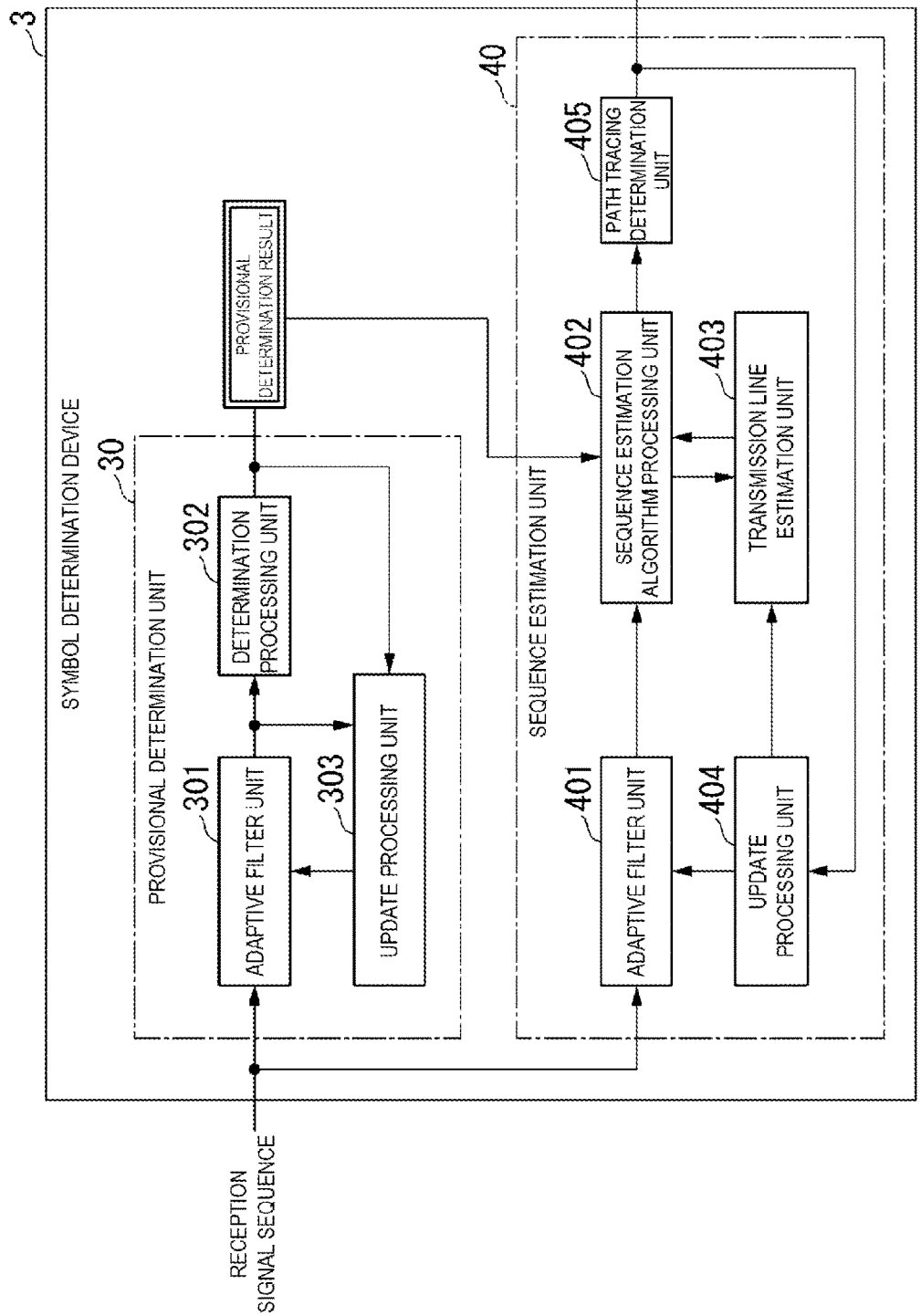
FIG. 2 is a block diagram illustrating an internal configuration of a symbol determination device according to the first embodiment.

The symbol determination device 3 is an identification circuit configured to identify a transmission symbol sequence based on the reception signal sequence $\{r_t\}$ output by the transmission line 2. The symbol determination device 3 is provided with the internal configuration illustrated in FIG. 2. The symbol determination device 3 includes a provisional determination unit (provisional determiner) 30 and a sequence estimation unit 40. A Feed Forward Equalizer (FFE) is, for example, applied to the provisional determination unit 30. The provisional determination unit 30 performs a hard determination by adaptively equalizing the reception signal sequence $\{r_t\}$ by a function of estimating the inverse transfer function (hereinafter referred to as an "estimation inverse transfer function"), and performs a provisional determination on the transmission symbol sequence.

The sequence estimation unit 40 generates the estimation reception symbol sequence by applying an estimation transfer function (H') to the symbol sequence indicating the transmission line state. The sequence estimation unit 40 calculates a metric on the basis of the generated estimation reception symbol sequence and the reception signal sequence $\{r_t\}$ compressing a pulse width. The sequence estimation unit 40 performs the Viterbi algorithm in a range of nearby symbols centered on each of the symbols provisionally determined by the provisional determination unit 30 by using the calculated metric. In this way, the sequence estimation unit 40 determines the estimation value of the transmission symbol sequence, that is, the estimation value of the m-valued data signal taken in by the signal generation device 1.

Figure 3:
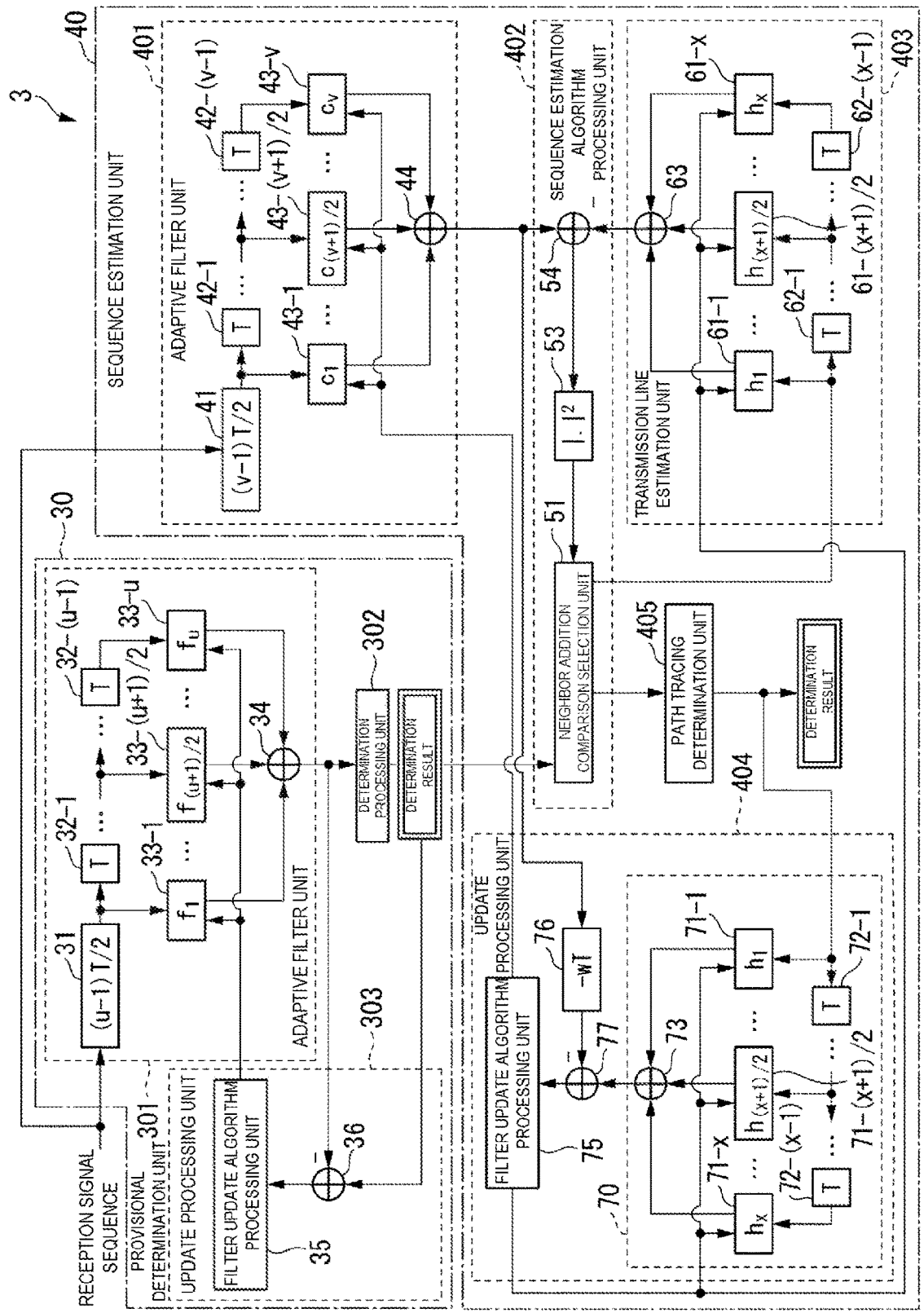
FIG. 3 is a block diagram illustrating a detailed internal configuration of the symbol determination device according to the first embodiment.

The provisional determination unit 30 includes an adaptive filter unit 301, a determination processing unit 302, and an update processing unit 303. The adaptive filter unit 301 is, for example, a linear transversal filter as illustrated in FIG. 3. The adaptive filter unit 301 adaptively equalizes the input signal by an estimation inverse transfer function that estimates the inverse transfer function of the transfer function (H) of the transmission line 2.

Figure 4:
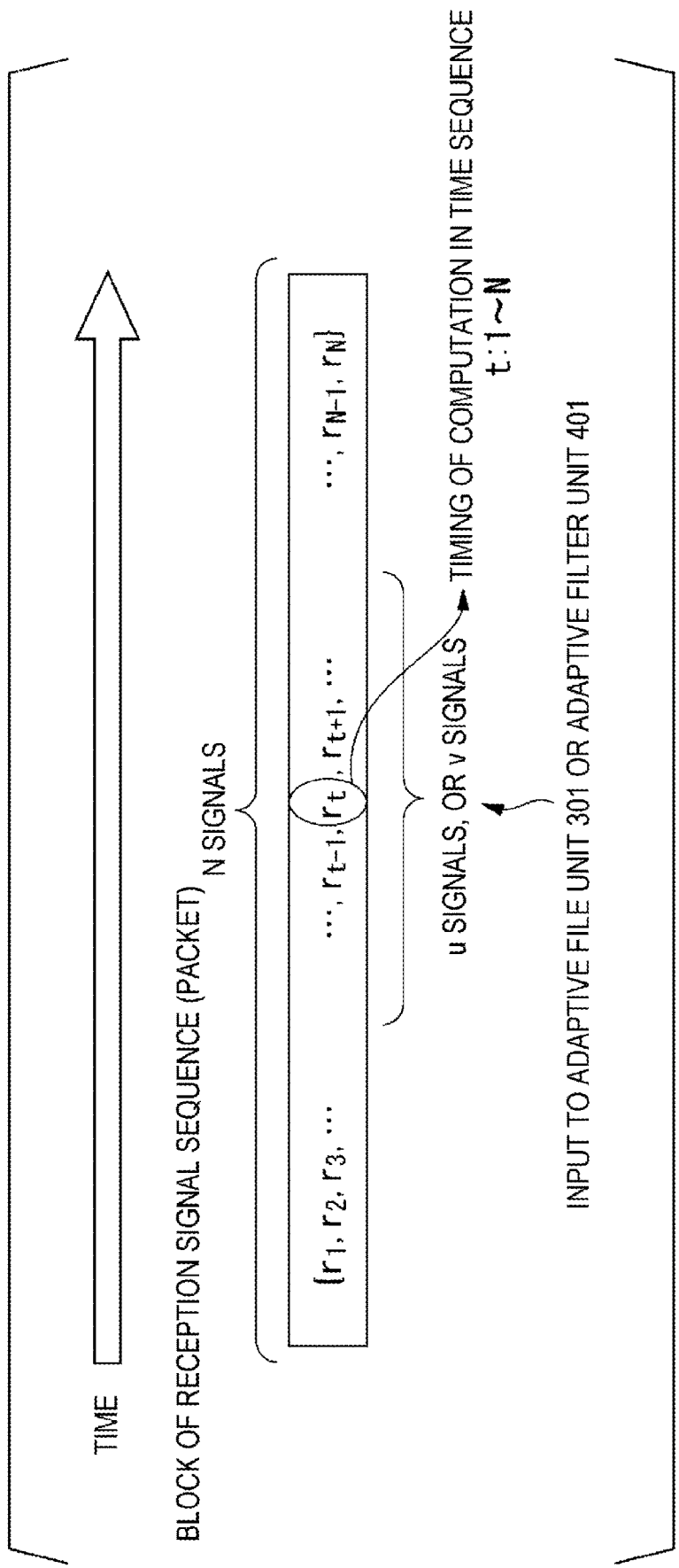
FIG. 4 is a diagram for describing sequences taken in by an adaptive filter unit according to the first embodiment.

The adaptive filter unit 301 includes delay units 31, 32-1 to 32-(u−1), taps 33-1 to 33-u, and an adder 34, as illustrated in FIG. 3. As illustrated in FIG. 4, the delay unit 31 takes in u symbol sequences that are part of the N reception signal sequences $\{r_t\}$. The delay unit 31 stores the symbol sequence taken in, and outputs the symbol sequence taken in after the time period of "(u−1) T/2" has elapsed, that is, that has been delayed by "(u−1)/2" symbols.

The tap 33-1 is given $r_{t+(u-1)/2}$, which is a symbol that has been delayed by "(u−1)/2" symbols output by the delay unit 31.

Each of the delay units 32-1 to 32-(u−1) takes in and stores one symbol, and outputs a symbol taken in after a time period of "T" has elapsed, that is, that has been delayed by one symbol. For example, the first delay unit 32-1 outputs a symbol of $r_{t+(u-3)/2}$ delayed by "(u−3)/2" symbols. The last delay unit 32-(u−1) outputs a symbol of $r_{t+(u-1)/2}$ delayed by "(u−1)/2" symbols. As a result, a signal including a symbol sequence having a sequence length u indicated by Equation (7) below is provided to the taps 33-1 to 33-u.

[Math. 7]

$$r_{t-(u-1)/2}, \ldots, r_t, \ldots, r_{t+(u-1)/2} \qquad (7)$$

Tap gain values of $f_1, f_2, \ldots, f_{(u+1)/2}, \ldots, f_u$, which are so-called filter coefficient values, are set for each of the taps 33-1 to 33-u. These tap gain values $f_1$ to $f_u$ represent the estimation inverse transfer function.

The taps 33-1 to 33-u multiply the symbols provided to each by the respective tap gain values $f_1$ to $f_u$ to output. The adder 34 adds up and outputs the output values of the taps 33-1 to 33-u. Equation (7) may be referred to as a sequence centered on $r_t$ which is a "(u+1)/2"-th element, and thus the output value of the adder 34 can be expressed as Equation (8) below.

[Math. 8]

$$\text{Out filter\_u} = \sum_{j=1}^{u} f_j r_{t-\frac{u+1}{2}+j} \tag{8}$$

The adaptive filter unit 301 provides a delay of "(u−1) T/2" by the delay unit 31. Thus, the u symbol sequences, which are input information corresponding to the output value of the computation timing tT of the linear digital filtering by the adaptive filter unit 301 are delayed by "(u−1) T/2".

The determination processing unit 302 makes a provisional determination on the output value of the adaptive filter unit 301 by a hard determination, and determines an estimation value of the transmission symbol corresponding to the output value. The determination processing unit 302 outputs a provisional determination symbol A', which is the estimation value determined, as a provisional determination result.

The update processing unit 303 calculates the update values of the tap gain values $f_1$ to $f_u$ of the respective taps 33-1 to 33-u of the adaptive filter unit 301 with the target value of the output value of the adaptive filter unit 301 as the provisional determination symbol A' output by the determination processing unit 302. For example, the update processing unit 303 calculates the update values of the tap gain values $f_1$ to $f_u$, that is, the estimation inverse transfer function, by a predetermined update algorithm.

As illustrated in FIG. 3, the update processing unit 303 includes a filter update algorithm processing unit 35, and a subtracter 36. In the update processing unit 303, the subtracter 36 subtracts the output value of the adaptive filter unit 301 from the provisional determination symbol A' output by the determination processing unit 302, and outputs the subtracted value obtained to the filter update algorithm processing unit 35 as an error.

Based on the error output by the subtracter 36, the filter update algorithm processing unit 35 calculates the update values of the tap gain values $f_t$ to $f_u$ by a predetermined update algorithm so as to reduce the error. The filter update algorithm processing unit 35 sets the calculated tap gain values $f_1$ to $f_u$ to the taps 33-1 to 33-u, and updates the tap gain values $f_1$ to $f_u$.

Figure 5:
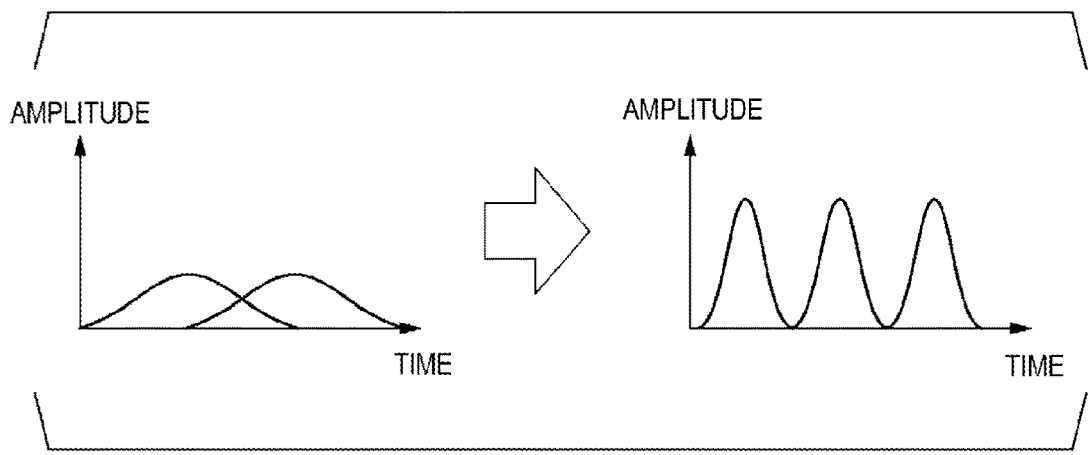
FIG. 5 is a diagram for describing compression of a pulse width performed by an adaptive filter unit of a sequence estimation unit according to the first embodiment.

The sequence estimation unit 40 includes an adaptive filter unit (adaptive filter) 401, a sequence estimation algorithm processing unit (sequence estimation algorithm processor) 402, a transmission line estimation unit (transmission line estimator) 403, an update processing unit (update processor) 404, and a path tracing determination unit (path tracing determiner) 405. The adaptive filter unit 401 is, for example, a linear transversal filter as illustrated in FIG. 3, and compresses an impulse response of the reception signal sequence $\{r_t\}$ to reduce the storage length of the transmission line estimation unit 403. Here, as illustrated in FIG. 5, the compression of the impulse response is compression of the pulse width of the reception signal sequence $\{r_t\}$ that has spread over time due to band restrictions or wavelength dispersion, and interference between symbols can be reduced by the compression.

The adaptive filter unit 401 includes delay units 41, 42-1 to 42-(v−1), taps 43-1 to 43-v, and an adder 44, as illustrated in FIG. 3. Similarly to the delay unit 31, the delay unit 41 takes in v symbol sequences that are part of the N reception signal sequences $\{r_t\}$, as illustrated in FIG. 4. Here, v may be the same value as u or may be a different value from u.

The delay unit 41 stores the symbol sequence taken in, and outputs the symbol sequence taken in after the time period of "(v−1) T/2" has elapsed, that is, that has been delayed by "(v−1)/2" symbols. The tap 43-1 is given $r_{t+(v-1)/2}$, which is a symbol output by the delay unit 41.

Each of the delay units 42-1 to 42-(v−1) takes in and stores one symbol, and outputs the symbol taken in after a time period of "T" has elapsed, that is, that has been delayed by one symbol. For example, the first delay unit 42-1 outputs a symbol of $r_{t+(v-3)/2}$ delayed by "(v−3)/2" symbols. The last delay unit 42-(v−1) outputs a symbol of $r_{t+(v-1)/2}$ delayed by "(v−1)/2" symbols. As a result, a signal including a symbol sequence having a sequence length v indicated by Equation (9) below is provided to the taps 43-1 to 43-v.

[Math. 9]

$$r_{t-(v-1)/2}, \ldots, r_t, \ldots, r_{t+(v-1)/2} \tag{9}$$

Tap gain values of $c_1, c_2, \ldots, c_{(v+1)/2}, \ldots, c_v$, which are so-called filter coefficient values, are set for each of the taps 43-1 to 43-v. The taps 43-1 to 43-v multiply the symbols provided to each by the respective tap gain values to output. The adder 44 adds up the output values of the taps 43-1 to 43-v and outputs the sum. Equation (9) may be referred to as a sequence centered on $r_t$ which is a "(v+1)/2"-th element, and thus in a case where the output value of the adder 44 is expressed by the equation, the following Equation (10) is obtained.

[Math. 10]

$$\text{Out filter\_v} = \sum_{j=1}^{v} c_j r_{t-\frac{v+1}{2}+j} \tag{10}$$

As can be seen from Equation (10), the adaptive filter unit 401 is adjusted in degree of influence by the tap gain values $c_1, c_2, \ldots, c_{(v+1)/2}, \ldots, c_v$, and outputs one output symbol in which the amount of information of the v symbol sequences are compressed.

The amount of computation of the MLSE is known to increase exponentially with respect to the width of the spread of the pulse, but it is possible to suppress the increase in the amount of computation by compressing the pulse width by the adaptive filter unit 401.

The adaptive filter unit 401 provides a delay of "(v−1) T/2" by the delay unit 41. Thus, the v symbol sequences, which are input information corresponding to the output value of the computation timing tT of the linear digital filtering by the adaptive filter unit 401 are delayed by "(v−1) T/2".

The transmission line estimation unit 403 is provided with a symbol sequence represented by a range of nearby symbols centered on each of the symbols that the provisional determination unit 30 has provisionally determined, among the symbol sequences representing the transmission line state $\mu_t$ of the transmission line 2 at the time t. The transmission line estimation unit 403 generates an estimation reception symbol sequence for each symbol sequence by applying an estimation transfer function (H') to each of the symbol sequences given from a neighbor addition comparison selection unit 51.

The transmission line estimation unit 403 is, for example, a linear transversal filter as illustrated in FIG. 3. The transmission line estimation unit 403 includes delay units 62-1 to 62-(x−1), taps 61-1 to 61-x, and an adder 63. Each of the delay units 62-1 to 62-($x$–1) takes in and stores one symbol, and outputs a symbol taken in after a time period of "T" has elapsed, that is, that has been delayed by one symbol. The transmission line state $\mu_t$ of the transmission line 2 at the time t given from the neighbor addition comparison selection unit 51 can be expressed as a symbol sequence {$s'_t$} indicated by Equation (11) below. Note that in a case where x matches the value of the storage length and the storage length is "3", x=3.

[Math. 11]

$$s'_{t-(x-1)/2}, \ldots, s'_t, \ldots, s'_{t+(x-1)/2} \quad (11)$$

Each of the taps 61-1 to 61-$x$ is given each of the symbols included in the symbol sequence {$s'_t$} of the Equation (11). Coefficient values $h_1, h_2, \ldots, h_{(x+1)/2}, \ldots, h_x$ of the estimation transfer function (H'), which are so-called filter coefficient values, are set for each of the taps 61-1 to 61-$x$. For example, the tap 61-1 performs computation of $h_1 * s'_{t-(x-1)/2}$. The taps 61-2 to 61-$x$ also multiplies each coefficient value by the given symbol and outputs the multiplication results to the adder 63. The adder 63 outputs the sum of the multiplication results. The output value of the adder 63 is a symbol constituting the estimation reception symbol sequence, and is expressed as Equation (12) below.

[Math. 12]

$$\text{Out filter\_x} = \sum_{j=1}^{x} h_j s'_{t - \frac{x+1}{2} + j} \quad (12)$$

The sequence estimation algorithm processing unit 402 calculates a metric for each transmission line state $\mu_t$. The sequence estimation algorithm processing unit 402 performs the Viterbi algorithm in a range of nearby symbols centered on each of the symbols provisionally determined by the provisional determination unit 30 by using the calculated metric for each transmission line state $\mu_t$.

The sequence estimation algorithm processing unit 402 includes a subtracter 54, an absolute value unit 53, and a neighbor addition comparison selection unit 51. The subtracter 54 subtracts the output value of the transmission line estimation unit 403 indicated by Equation (12) from the output value of the adaptive filter unit 401 indicated by Equation (10). The subtracter 54 outputs the subtracted value obtained by subtracting to the absolute value unit 53. The absolute value unit 53 calculates the absolute value of the subtracted value received from the subtracter 54. The absolute value calculated by the absolute value unit 53 is a metric and is expressed as Equation (13) below.

[Math. 13]

$$b(r_t; u_{t-1} \to \mu_t) = \left| \sum_{j=1}^{v} c_j r_{t - \frac{v+1}{2} + j} - \sum_{j=1}^{x} h_j s'_{t - \frac{x+1}{2} + j} \right|^2 \quad (13)$$

The neighbor addition comparison selection unit 51 takes in a plurality of provisional determination symbols A' output by the provisional determination unit 30 as a provisional determination result. The neighbor addition comparison selection unit 51 uses the plurality of provisional determination symbols A' to generate a provisional determination symbol sequence {A'$_t$} having a length of a predetermined storage length as a sequence length. The neighbor addition comparison selection unit 51 generates a plurality of symbol sequences {s'$_t$} represented by a range of nearby symbols centered on each of the symbols included in the provisional determination symbol sequence {A't} among the symbol sequences representing the transmission line state $\mu_t$ of the transmission line 2 at the time t. The neighbor addition comparison selection unit 51 outputs the plurality of generated symbol sequences {s'$_t$} to the transmission line estimation unit 403.

The neighbor addition comparison selection unit 51 performs the Viterbi algorithm in a range of nearby symbols centered on each of the symbols included in the provisional determination symbol sequence {A'$_t$} by using a metric for each transmission line state $\mu_t$ output by the absolute value unit 53. The neighbor addition comparison selection unit 51 performs the Viterbi algorithm to calculate a distance function $d_t$ ({$\mu_t$}) indicating the likelihood of the estimation reception symbol sequence, and detects a minimum value of the calculated distance function $d_t$ ({$\mu_t$}). The estimation reception symbol sequence corresponding to the minimum value is the most likelihood estimation reception symbol sequence.

Based on the minimum value of the distance function $d_t$ ({$\mu_i$}) detected by the neighbor addition comparison selection unit 51, the path tracing determination unit 405 determines the transmission symbol by tracing back the path of the trellis. Note that the starting point of the tracing path is in a transmission line state in which the distance function $d_t$ ({$\mu_t$}) when the transmission line state $\mu_t$ is reached at time t is a minimum value. The number of tracing back "w" when the path tracing determination unit 405 traces back the path is predetermined, and it is possible to reduce the amount of computation for determining the path by setting the number of tracing back "w" to a fixed value. Note that it is known that the path converges by tracing back a certain number of times the storage length of the transmission line estimation unit 403.

The path tracing determination unit 405 makes each symbol obtained by the symbol determination as the determination symbol A. The path tracing determination unit 405 outputs the determination symbols A as the determination result. The determination symbol sequence {A$_t$} in which the determination symbols A determined sequentially by the path tracing determination unit 405 are arranged in a sequence is assumed to be the estimation value of the transmission symbol sequence, that is, the estimation value of the m-valued data taken in by the signal generation device 1.

The update processing unit 404 calculates the tap gain values $c_1$ to $c_v$ of the adaptive filter unit 401 and the coefficient values $h_1$ to $h_x$ of the estimation transfer function of a filter update transmission line estimation unit 70.

When calculating the tap gain values $c_1$ to $c_v$ of the adaptive filter unit 401, the update processing unit 404 sets the target value of the output value of the adaptive filter unit 401 as the output value of the filter update transmission line estimation unit 70 that uses the determination symbol sequence {A$_t$}, which is the determination result, as input information. The update processing unit 404 calculates the update values for the tap gain values $c_1$ to $c_v$ of each of the taps 43-1 to 43-$v$ of the adaptive filter unit 401 so as to be the target value by a predetermined update algorithm.

When calculating the coefficient values $h_1$ to $h_x$ of the estimation transfer function of the filter update transmission line estimation unit 70, the update processing unit 404 sets the target value of the output value of the filter update transmission line estimation unit 70 as the output value of the adaptive filter unit 401. The update processing unit 404 calculates the update values of the coefficient values $h_1$ to $h_x$ of each of the taps 71-1 to 71-$x$ of the filter update transmission line estimation unit 70 so as to be the target value by a predetermined update algorithm. The update values of the coefficient values $h_1$ to $h_x$ calculated by the update processing unit 404 are also applied to the taps 61-1 to 61-$x$ of the transmission line estimation unit 403.

As illustrated in FIG. 3, the update processing unit 404 includes a filter update transmission line estimation unit 70, a filter update algorithm processing unit 75, a delay unit 76, and a subtracter 77. The configuration of the filter update transmission line estimation unit 70 corresponds to the configuration of the transmission line estimation unit 403, where the taps 61-1 to 61-$x$ correspond to the taps 71- to 71-$x$, the delay units 62-1 to 62-($x$–1) correspond to the delay units 72-1 to 72-($x$–1), and the adder 63 corresponds to the adder 73.

The delay unit 76 delays the output value of the adaptive filter unit 401 for a time of "–wT" and outputs the delayed output value to the subtracter 77. To delay the time of "–wT" is because in the processing in the path tracing determination unit 405, a delay of "–wT" occurs. By the delay of "–wT" by the delay unit 76, the timings of the output value of the filter update transmission line estimation unit 70 and the output value of the adaptive filter unit 401 match.

The subtracter 77 subtracts the output value of the adaptive filter unit 401 that has been delayed by the time of "–wT" from the output value of the filter update transmission line estimation unit 70, and outputs the error obtained by the subtraction to the filter update algorithm processing unit 75.

Based on an error output by the subtracter 77, the filter update algorithm processing unit 75 calculates the update values of the tap gain values $c_1$ to $c_v$ by a predetermined update algorithm so as to reduce the error. Based on the error output by the subtracter 36, the filter update algorithm processing unit 75 calculates the update values of the coefficient values $h_1$ to $h_x$ by a predetermined update algorithm so as to reduce the error.

The filter update algorithm processing unit 75 sets the calculated tap gain values $c_1$ to $c_v$ to the taps 43-1 to 43-$v$, to update the tap gain values $c_1$ to $c_v$. The filter update algorithm processing unit 75 sets the calculated coefficient values $h_1$ to $h_x$ to the taps 71-1 to 71-$x$ and the taps 61-1 to 61-$x$ of the transmission line estimation unit 403, to update the coefficient values $h_1$ to $h_x$.

Processing by Symbol Determination Device According to First Embodiment Next, processing by the symbol determination device 3 according to the first embodiment will be described with reference to FIGS. 6 to 9.

Figure 6:
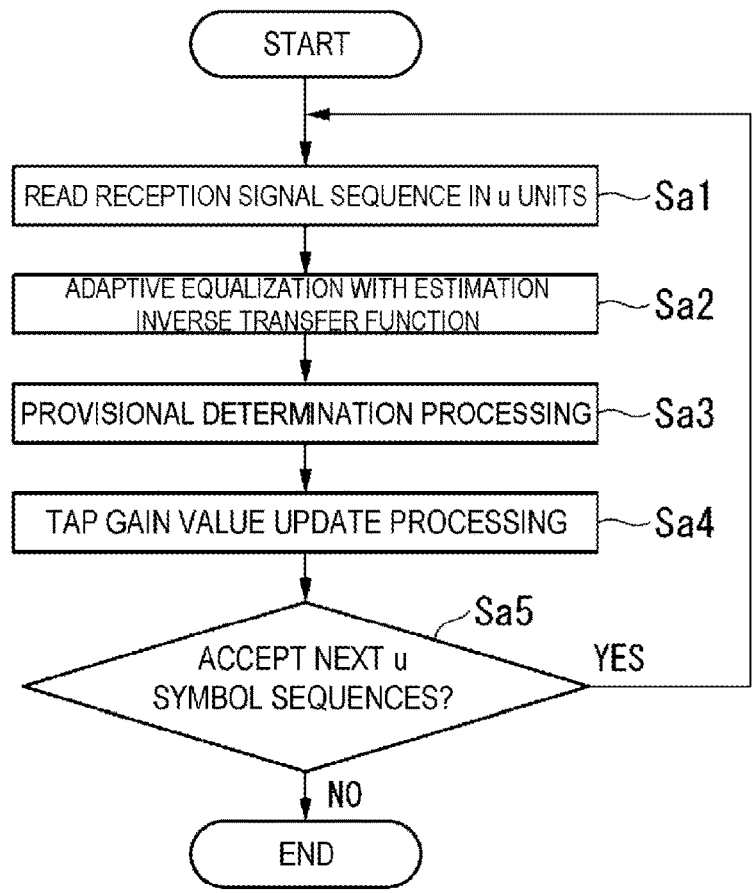
FIG. 6 is a flowchart illustrating a flow of processing by a provisional determination unit of the symbol determination device according to the first embodiment.

Processing by Provisional Determination Unit According to First Embodiment FIG. 6 is a flowchart illustrating a flow of processing by the provisional determination unit 30 of the symbol determination device 3.

The delay unit 31 of the adaptive filter unit 301 takes in and stores the symbol sequence of the sequence length u from the reception signal sequence $\{r_t\}$ (step Sa1). The delay unit 31 delays the symbol sequence taken in by the time period of "(u–1) T/2" to output. Each of the delay units 32-1 to 32-($u$–1) takes in and stores the symbols sequentially output by the delay unit 31, and outputs the stored symbols after a time period of "T" has elapsed.

As a result, the symbol sequence of the reception signal sequence $\{r_t\}$ indicated by Equation (7) is given to the taps 33-1 to 33-$u$. The taps 33-1 to 33-$u$ multiply the symbols $r_{t-(u-1)/2}$ to $r_{t+(u-1)/2}$ given to each with the tap gain values $f_1$ to $f_u$ set to each, and outputs the multiplied results to the adder 34. The adder 34 calculates and outputs the output value indicated by Equation (8) by summing the multiplication results. This output value is a symbol of a reception signal sequence $\{r_t\}$ that is adaptively equalized by the estimation inverse transfer function (step Sa2).

The determination processing unit 302 makes a provisional determination on the output value of the adaptive filter unit 301 by a hard determination, and determines an estimation value of the transmission symbol. The determination processing unit 302 outputs a provisional determination symbol A', which is the estimation value determined, as a provisional determination result (step Sa3).

The subtracter 36 subtracts the output value of the adaptive filter unit 301 from the provisional determination symbol A' output by the determination processing unit 302, and outputs the subtracted value obtained to the filter update algorithm processing unit 35 as an error.

Based on the error output by the subtracter 36, the filter update algorithm processing unit 35 calculates the update values of the tap gain values $f_t$ to $f_u$, that is, the estimation inverse transfer function, by a predetermined update algorithm so as to reduce the error. The filter update algorithm processing unit 35 sets the calculated tap gain values $f_1$ to $f_u$ to the taps 33-1 to 33-$u$, and updates the tap gain values $f_1$ to $f_u$ (step Sa4).

In a case where the delay unit 31 of the adaptive filter unit 301 can take in a symbol sequence of the sequence length u from the reception signal sequence $\{r_t\}$ with the symbol shifted by one symbol from the beginning of the symbol sequence of the sequence length u taken in in the previous step Sa1 as the beginning (step Sa5, Yes), the provisional determination unit 30 performs processing in step Sa1. On the other hand, in a case where the delay unit 31 cannot take in a symbol sequence of the sequence length u from the reception signal sequence $\{r_t\}$ with the symbol shifted by one symbol from the beginning of the symbol sequence of the sequence length u taken in, in the previous step Sa1 as the beginning (step Sa5, No), the provisional determination unit 30 terminates the processing.

Figure 7:
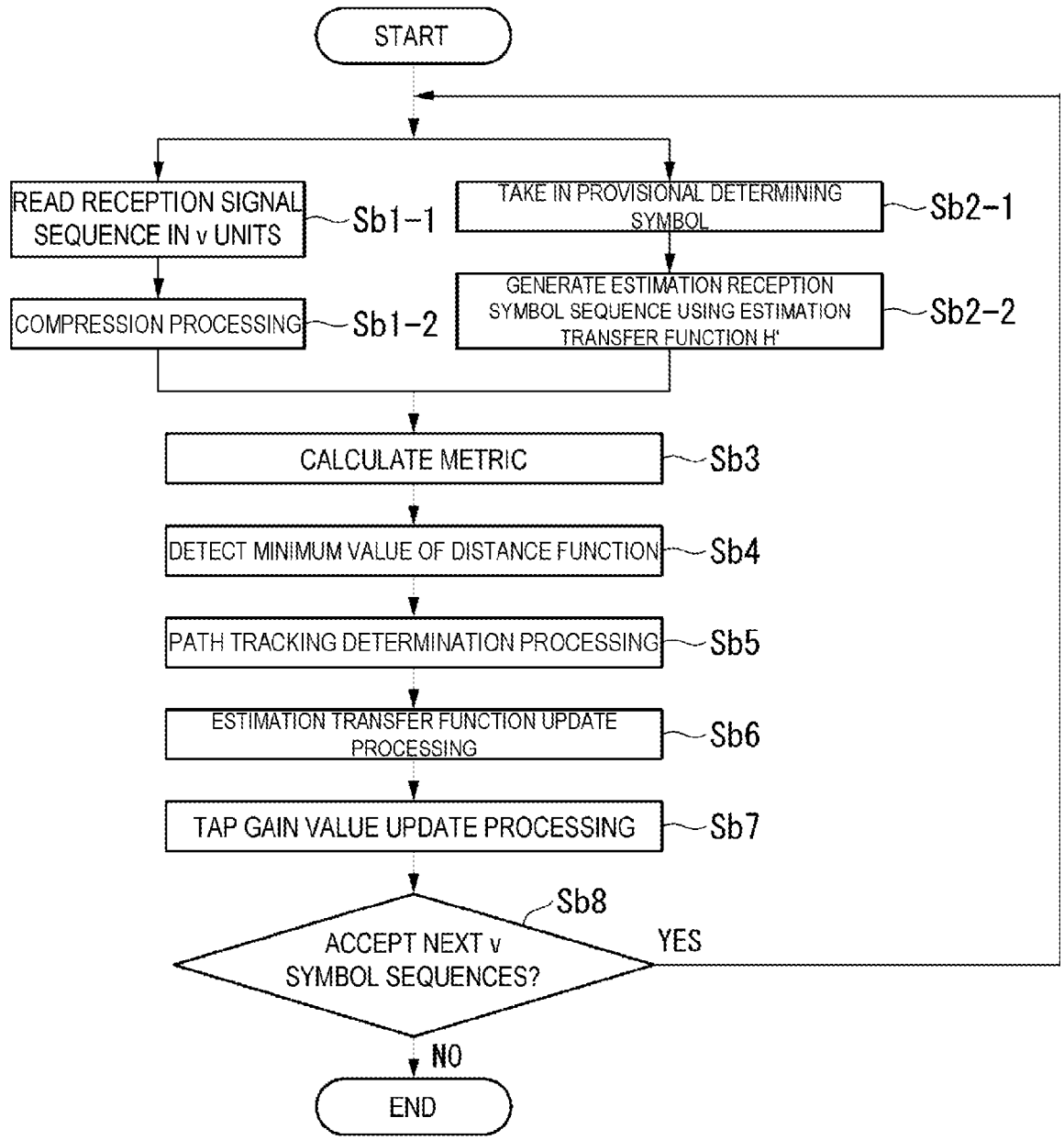
FIG. 7 is a flowchart illustrating a flow of processing by a sequence estimation unit of the symbol determination device according to the first embodiment.

Processing by Sequence Estimation Unit According to First Embodiment FIG. 7 is a flowchart illustrating a flow of processing by the sequence estimation unit 40 of the symbol determination device 3. The delay unit 41 of the adaptive filter unit 401 takes in and stores the symbol sequence of the sequence length v from the reception signal sequence $\{r_t\}$ (step Sb1-1). The delay unit 41 delays the symbol sequence taken in by the time period of "(v–1) T/2" to output. Each of the delay units 42-1 to 42-($v$–1) takes in and stores the symbols sequentially output by the delay unit 41, and outputs the stored symbols after a time period of "T" has elapsed.

As a result, the symbol sequence of the reception signal sequence $\{r_t\}$ indicated by Equation (9) is given to the taps 43-1 to 43-$v$. The taps 43-1 to 43-$v$ multiply the symbols $r_{t-(v-1)/2}$ to $r_{t+(v-1)/2}$ given to each with the tap gain values $c_1$ to $c_v$ set to each, and outputs the multiplied results to the adder 44. The adder 44 calculates the output value indicated by Equation (10) by summing the multiplication results, and outputs the calculated output value as the symbol compressing the amount of information of the reception signal sequence $\{r_t\}$ (step Sb1-2).

In parallel with processing of steps Sb1-1 and Sb1-2, the neighbor addition comparison selection unit 51 takes in a plurality of provisional determination symbols A' output by the provisional determination unit 30 as a provisional determination result (step Sb2-1). The neighbor addition comparison selection unit 51 generates a provisional determination symbol sequence $\{A'_t\}$ having a length of a predetermined storage length as a sequence length. For example, suppose that the symbol sequence in which the symbols taken in by the neighbor addition comparison selection unit 51 are arranged is $[A'_{t-(p-1)/2}, \ldots, A'_{t-1}, A'_t, A'_{t+1}, \ldots, A'_{t+(p-1)/2}]$.

At this time, suppose that the storage length is predetermined to be "3", and the range of adjacent symbols is predetermined to be adjacent ±1 symbols. Because the storage length is "3", the neighbor addition comparison selection unit 51 selects, for example, "$A'_t$" at the time t and $[A'_{t-1}, A'_t, A'_{t+1}]$ including one symbol before and after "$A'_t$" as the provisional determination symbol sequence $\{A'_t\}$.

Figure 8:
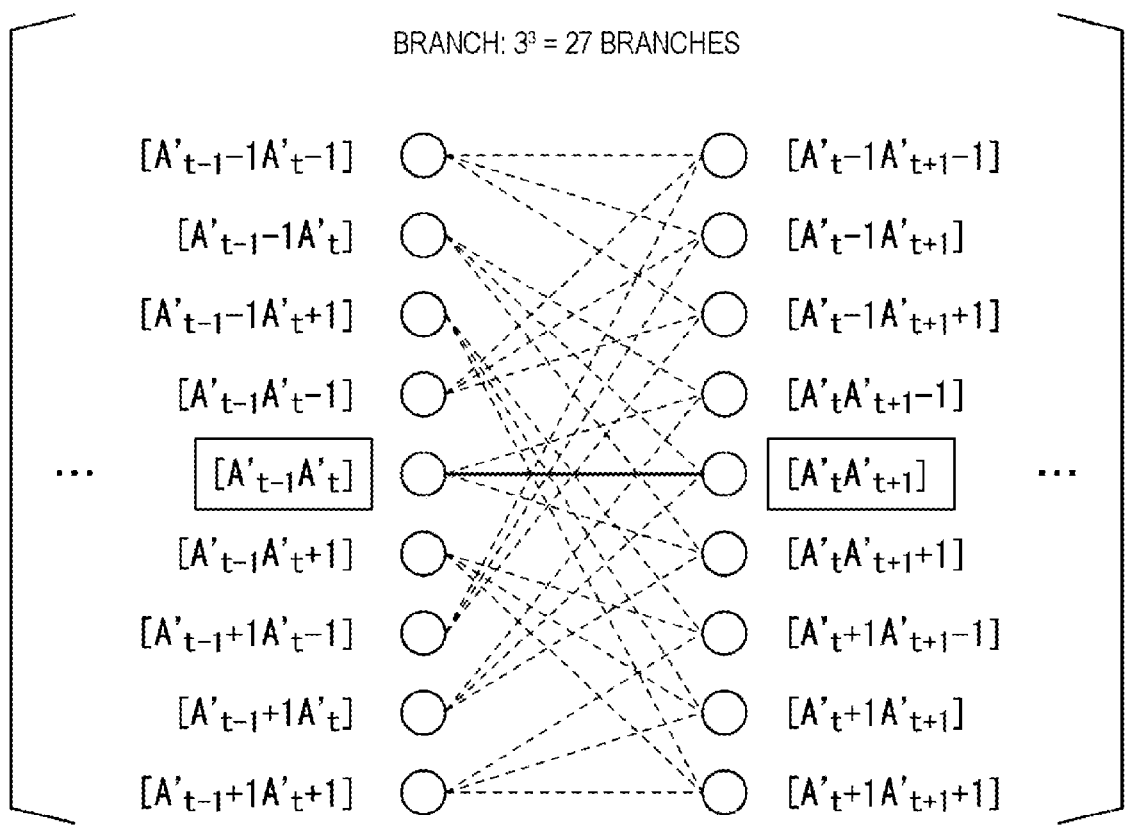
FIG. 8 is a trellis diagram illustrating states to be computed by a neighbor addition comparison selection unit of the sequence estimation unit according to the first embodiment.

As illustrated in FIG. 8, the neighbor addition comparison selection unit 51 sets a range of adjacent ±1 symbols in each of the symbols included in the provisional determination symbol sequence $[A'_{t-1}, A'_t, A'_{t+1}]$ indicated by a solid line near the center in the trellis diagram as a symbol sequence $\{s'_t\}$ indicating a transmission line state $\mu_t$ of the transmission line 2 at time t.

In other words, the branches of the trellis indicated by (1) three symbols of $[A'_{t-1}]$, and $[A'_{t-1}+1]$ and $[A'_{t-1}-1]$ that are ±1 adjacent to $[A'_{t-1}]$. (2) three symbols of $[A'_t]$, and $[A'_t+1]$ and $[A'_t-1]$ that are ±1 adjacent to $[A'_t]$, and (3) three symbols of $[A'_{t+1}]$, and $[A'_{t+1}+1]$ and $[A'_{t+1}-1]$ that are ±1 adjacent to $[A'_{t+1}]$, that is, the branches of the trellis indicated by dashed lines and a solid line in FIG. 8, are the range of the transmission line state $\mu_t$.

As described above, in a case where the symbol multi-level degree is "m" and the symbol sequence length is "p", the number of branches of the trellis is $m^p$. Even if the storage length is "3", the number of branches is $m^3$. In contrast, as described above, by setting the symbols to adjacent ±1 symbols, m can be set to m=3, so the number of branches can be narrowed down to $3^3=27$ as illustrated in FIG. 8.

The neighbor addition comparison selection unit 51 outputs, to the transmission line estimation unit 403, a symbol sequence representing each of the transmission line states $\mu_t$, which is narrowed down to a range of nearby symbols centered on each of the provisional determination symbols. This symbol sequence is expressed by the Equation (11), and in a case where the storage length is "3," the symbol sequence is $[s'_{t-1}, s'_t, s'_{t+1}]$.

Each of the delay units 62-1 to 62-(x−1) of the transmission line estimation unit 403 stores the symbols taken in, and outputs the symbols taken in after a time period of "T" has elapsed. Each of the taps 61-1 to 61-x is given each of the symbols included in the symbol sequence $\{s'_t\}$.

The taps 61-1 to 61-x multiplies each of the coefficient values $h_1$ to $h_x$ and the given symbols, and outputs the multiplication results to the adder 63. The adder 63 calculates and outputs the output value indicated by Equation (12) by summing the multiplication results. The output values output sequentially by the adder 63 are symbols constituting the estimation reception symbol sequence (step Sb2-2).

The subtracter 54 subtracts the output value of the transmission line estimation unit 403 indicated by Equation (12) from the output value of the adaptive filter unit 401 indicated by Equation (10), and outputs the subtracted value obtained by subtracting to the absolute value unit 53. The absolute value unit 53 calculates the absolute value of the subtracted value received from the subtracter 54. The absolute value calculated by the absolute value unit 53 is a metric indicated by Equation (13) (step Sb3).

For example, in a case where the neighbor addition comparison selection unit 51 narrows down the number of branches of the trellis to 27, each of the transmission line states $\mu_t$ is 27 symbol sequences $\{s'_t\}$ from the first branch $[A'_{t-1}-1, A'_{t-1}, A'_{t+1}-1]$ to the last branch $[A'_{t-1}+1, A'_t+1, A'_{t+1}+1]$ illustrated in FIG. 8. The transmission line estimation unit 403 applies the estimation transfer function (H') to each of the 27 symbol sequences $\{s't\}$, and calculates 27 output values indicated by Equation (12). Thus, the absolute value unit 53 will also calculate 27 metrics.

The neighbor addition comparison selection unit 51 performs the Viterbi algorithm in the range of adjacent ±1 symbols in each of the symbols included in the provisional determination symbol sequence $[A'_{t-1}, A'_t, A'_{t+1}]$ indicated by a solid line near the center in the trellis diagram illustrated in FIG. 8. The neighbor addition comparison selection unit 51 performs the Viterbi algorithm to calculate a distance function $d_t(\{\mu_t\})$ and detects a minimum value of the calculated distance function $d_t(\{\mu_t\})$ (step Sb4).

The path tracing determination unit 405 performs symbol determination on the basis of the minimum value of the distance function $d_t(\{\mu_t\})$ calculated by the neighbor addition comparison selection unit 51 by tracing back the path of the trellis, and determines the determination symbol A. The path tracing determination unit 405 outputs the determination symbol A as the determination result (step Sb5). The determination symbol sequence $\{A_t\}$ in which the determination symbols A determined sequentially by the path tracing determination unit 405 are arranged in a sequence is assumed to be the estimation value of the transmission symbols, that is, the estimation value of the m-valued data taken in by the signal generation device 1.

Each of the delay units 72-1 to 72-(x−1) of the filter update transmission line estimation unit 70 takes in and stores the determination symbols A sequentially output by the path tracing determination unit 405, and outputs the determination symbol A stored after the time period of "T" has elapsed. Each of the taps 71-1 to 71-x is given each of the symbols included in the determination symbol sequence $\{A_t\}$. The taps 71-1 to 71-x multiplies each of the coefficient values $h_1$ to $h_x$ and the given symbols, and outputs the multiplication results to the adder 73. The adder 73 calculates and outputs the sum of the multiplication results.

The delay unit 76 delays the output value of the adaptive filter unit 401 for a time of "−wT", that is, for "−w" symbols, and outputs it to the subtracter 77. The subtracter 77 subtracts the output value of the adaptive filter unit 401 that has been delayed by the time of "−wT" from the output value of the filter update transmission line estimation unit 70, and outputs the error obtained by the subtraction to the filter update algorithm processing unit 75.

Based on the error output by the subtracter 77, the filter update algorithm processing unit 75 calculates the update values of the coefficient values $h_1$ to $h_x$ by a predetermined update algorithm so as to reduce the error. The filter update algorithm processing unit 75 sets the calculated coefficient values $h_1$ to $h_x$ to the taps 71-1 to 71-x corresponding to each and the taps 61-1 to 61-x of the transmission line estimation unit 403, and updates the coefficient values $h_1$ to $h_x$ (step Sb6).

Based on the error output by the subtracter 77, the filter update algorithm processing unit 75 calculates the update values of the tap gain values $c_1$ to $c_v$ by a predetermined update algorithm so as to reduce the error. The filter update algorithm processing unit 75 sets the calculated tap gain values $c_1$ to $c_v$ to the taps 43-1 to 43-v corresponding to each, and updates the tap gain values $c_1$ to $c_v$ (step Sb7).

In a case where the delay unit 41 of the adaptive filter unit 401 can take in a symbol sequence of the sequence length v from the reception signal sequence {$r_t$} with the symbol shifted by one symbol from the beginning of the symbol sequence of the sequence length v taken in in the previous step Sb1-1 as the beginning (step Sb8, Yes), the processing of steps Sb1-1 and Sb2-1 is performed. On the other hand, in a case where the delay unit 41 fails to take in a symbol sequence of the sequence length v from the reception signal sequence {$r_t$} with the symbol shifted by one symbol from the beginning of the symbol sequence of the sequence length v taken in in the previous step Sb1-1 as the beginning (step Sb8, No), the processing is terminated.

Note that, in the processing illustrated in FIG. 7 described above, the order of processing of step Sb6 and step Sb7 may be inversed.

In the configuration of the above-described first embodiment, the provisional determination unit 30 performs adaptive equalization on the reception signal sequence taken in from the transmission line 2 by the estimation inverse transfer function of the transmission line 2 to generate a symbol sequence, and performs provisional determination on the generated symbol sequence. The transmission line estimation unit 403 generates an estimation reception symbol sequence for each transmission line state based on a plurality of symbol sequences indicating the transmission line states and the estimation transfer function of the transmission line 2. The sequence estimation algorithm processing unit 402 calculates a metric between symbol sequences obtained from the reception signal sequence and each of estimation reception symbol sequences, and selects the most likelihood estimation reception symbol sequence by a predetermined estimation algorithm on the basis of the calculated metrics, the provisional determination symbols provisionally determined by the provisional determination unit 30, and the nearby symbols of the provisional determination symbol. The sequence estimation algorithm processing unit 402 generates a plurality of symbol sequences indicating a transmission line state in a range of provisional determination symbols provisionally determined by the provisional determination unit 30 and nearby symbols of the provisional determination symbols. The path tracing determination unit 405 determines the transmission symbol sequence by tracking back the path of the trellis, based on the most likelihood estimation reception symbol sequence. Thus, the sequence estimation algorithm processing unit 402 may perform computation by narrowing down to a range of the provisional determination symbols provisionally determined by the provisional determination unit 30 and the nearby symbols of the provisional determination symbols, that is, by reducing the number of branches in the trellis. Thus, when determining a transmission symbol from a reception signal sequence, even in a case where the symbol multi-level degree increases, it is possible to prevent an increase in the amount of computation without increasing the number of branches of the trellis.

In the Viterbi algorithm, as mentioned above, it is assumed that the minimum value of the distance function $d\_min_{t-1}(\mu_{t-1})$ that reaches the transmission line state $\mu_t$, and the all state transitions corresponding to this are known in all transmission line states $\mu_{t-1}$ at time t−1. From this assumption, in a case of calculating a minimum value of a distance function $d_t(\{\mu_t\})$ reaching the transmission line state $\mu_t$, it is not necessary to calculate distance functions $d_t(\{\mu_t\})$ corresponding to all state transitions, but it is sufficient to calculate $d\_min_{t-1}(\mu_{t-1})+b(r_t; \mu_{t-1} \rightarrow \mu_t)$ for all transmission line conditions {$\mu_{t-1}$} that have possibility to transition to the transmission line state $\mu_t$. In this way, although the amount of computation of the Viterbi algorithm is small, the amount of computation of the Viterbi algorithm has the number of branches of the trellis being dominant, and the amount of computation increases when estimating high multi-level degree symbols or wide inter-symbol interference. In contrast, in the configuration of the first embodiment described above, the neighbor addition comparison selection unit 51 further calculates a distance function $d_t(\{\mu_t\})$ reaching the transmission line state $\mu_t$ by narrowing down to a range of nearby symbols centered on each of the symbols included in the provisional determination symbol sequence {$A'_t$} provisionally determined by the provisional determination unit 30, so it is possible to further reduce the amount of computation.

In conventional MLSE, for example, in a case of the storage length "3," the number of branches in the trellis is $m^3$. Because $m_3$ symbol sequences are given to the transmission line estimation unit 403, the transmission line estimation unit 403 needs to perform computation $m^3$ times, and the number of metrics calculated by the absolute value unit 53 is also $m^3$. In contrast, in the configuration of the first embodiment described above, the neighbor addition comparison selection unit 51 generates a symbol sequence representing the transmission line state it by narrowing down to a range of nearby symbols centered on each of the symbols included in the provisional determination symbol sequence {$A'_t$}. Thus, even in a case where the symbol multi-level degree m increases, by limiting the range of nearby symbols centered on each of the symbols included in the provisional determination symbol sequence {$A'_t$} in advance, it is possible to suppress an increase in the amount of computation caused by the increase in the symbol multi-level degree.

For example, as described above, the FFE is applied to the provisional determination unit 30, and the FFE, is an adaptive equalization technique with a small amount of computation. Thus, as in the symbol determination device 3 according to the first embodiment, the method for initially performing the provisional determination of symbols by the FFE with a small amount of computation and narrowing down to a range of nearby symbols centered on each of the provisional determination symbols obtained as a provisional determination result can perform symbol estimation with a smaller amount of computation than the method in which all the symbol estimation is performed by the MLSE.

In a case of estimating Inter-Symbol Interference (ISI) greater than adjacent ±1, as a range of nearby symbols, adjacent ±n is set (where n is an integer of 2 or greater). In this case, if the storage length is "3", the number of branches in the trellis is $(2n+1)^3$, and if the storage length is "q", the number of branches in the trellis can be represented by the general equation of $(2n+1)^q$. From the perspective of manufacturing cost and power consumption of signal processing chips at the present time, a value of n=1, 2 is a practical value, but the value of n can be further increased depending on the performance of the future semiconductor processing technology, that is, the improvement in signal processing performance.

Figure 9:
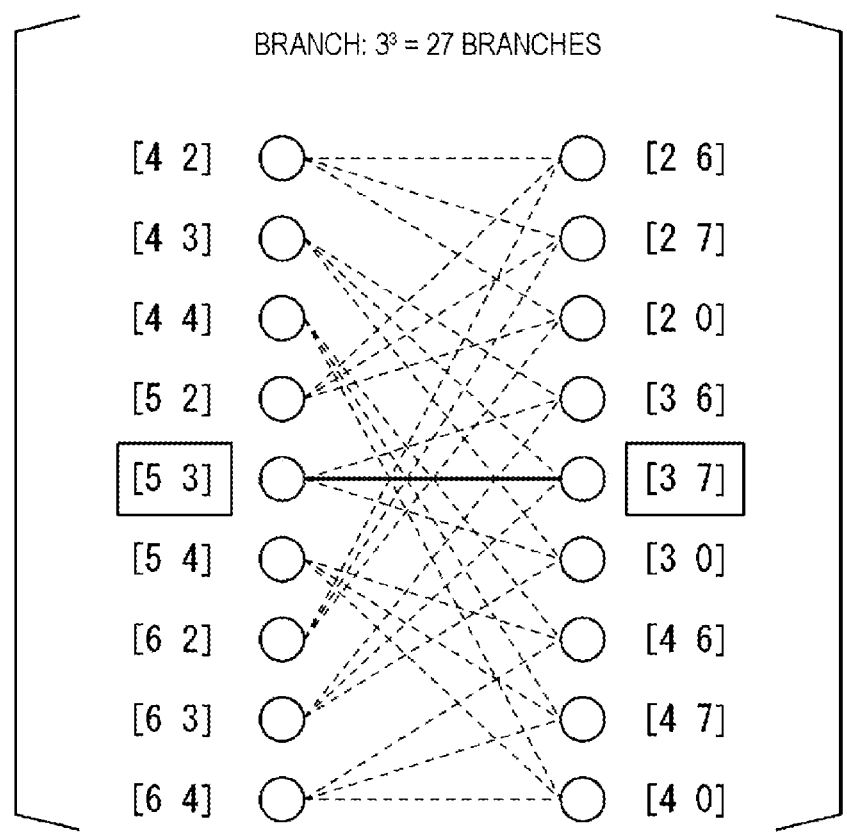
FIG. 9 is a trellis diagram in a case where the symbol multi-level degree is 8 in FIG. 8.

Note that in FIG. 8, in a case where there is no symbol corresponding to $A'_t+1$, $A'_t-1$, or the like, for example, a symbol in which [$i_1, i_2, \ldots, i_m$] has been shifted is used. In a case of $i_1-1$, the symbol is $i_m$, and in a case of $i_m+1$, the symbol is $i_1$. These symbols are not in the vicinity of the provisional determination symbols, but are not selected as the final determination results because the distance function $d_t(\{\mu_t\})$ increases. In a case of an 8-value data signal, a case where the storage length is "3" and [5, 3, 7] is obtained as the provisional determination symbols, a trellis diagram such as that illustrated in FIG. 9 is obtained.

Note that, in the configuration of the first embodiment described above, the sequence estimation unit 40 may be configured not to include the adaptive filter unit 401. In this case, the subtracter 54 of the sequence estimation algorithm processing unit 402 takes in the reception signal sequence $\{r_t\}$ instead of the output value of the adaptive filter unit 401.

Second Embodiment

Figure 10:
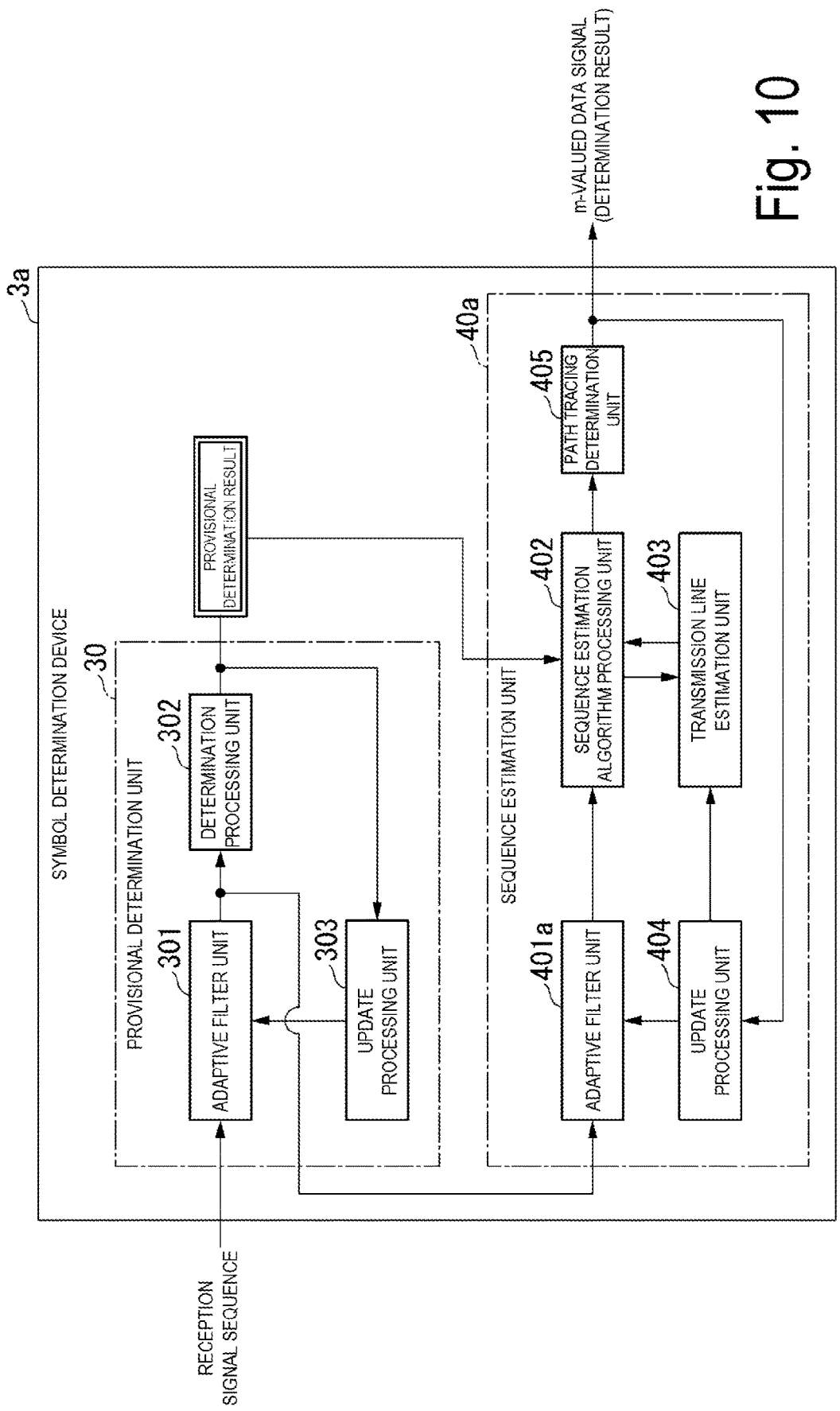
FIG. 10 is a block diagram illustrating an internal configuration of a symbol determination device according to a second embodiment.
Figure 11:
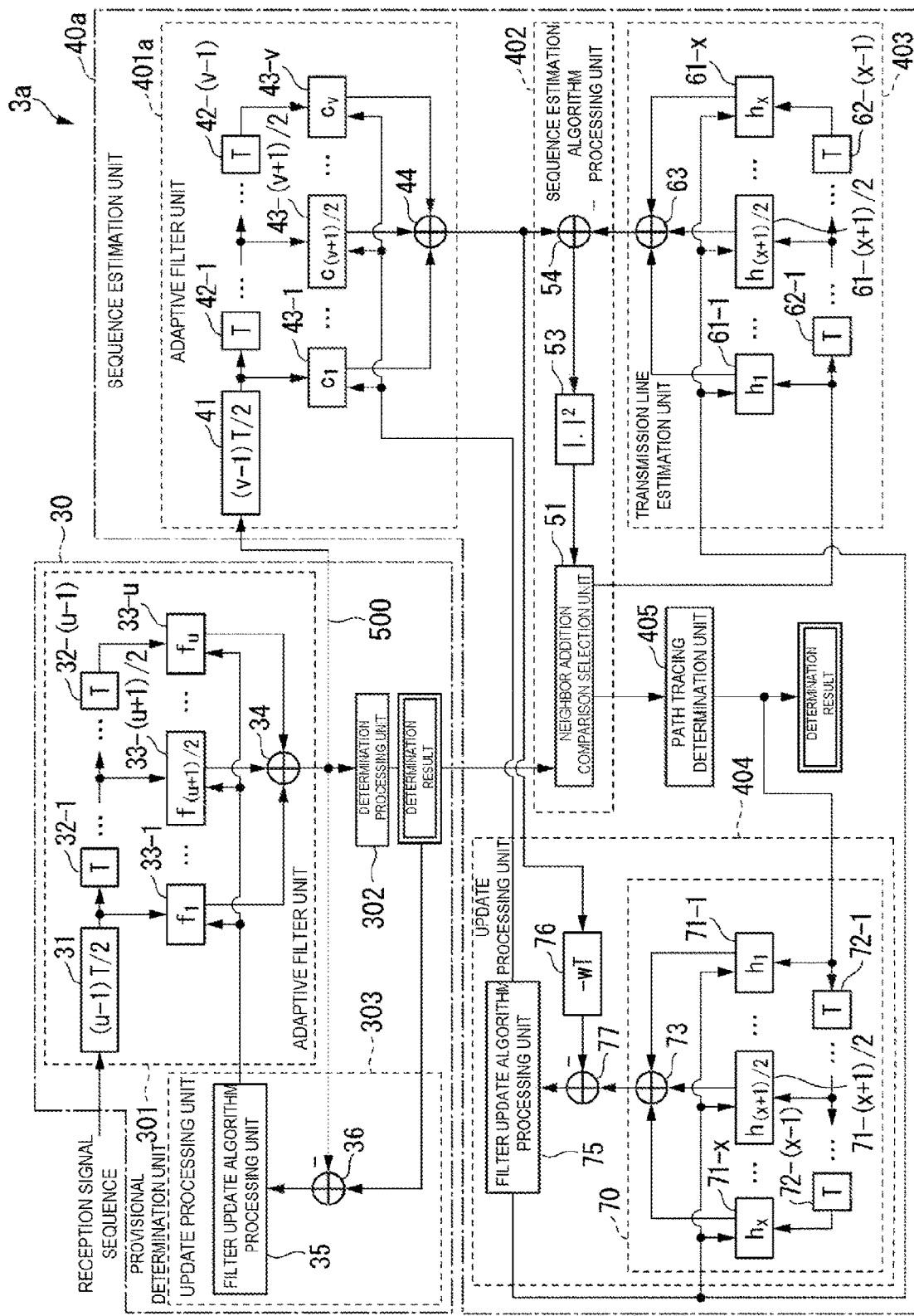
FIG. 11 is a block diagram illustrating a detailed internal configuration of the symbol determination device according to the second embodiment.

FIG. 10 is a block diagram illustrating an internal configuration of a symbol determination device 3a according to the second embodiment. FIG. 11 is a block diagram illustrating a detailed internal configuration of the symbol determination device 3a according to the second embodiment. In the second embodiment, the same reference signs will be assigned to the same components as those in the first embodiment, and hereinafter, different components will be described.

As illustrated in FIG. 10, the symbol determination device 3a includes a provisional determination unit 30 and a sequence estimation unit 40a. The sequence estimation unit 40a includes an adaptive filter unit 401a, a sequence estimation algorithm processing unit 402, a transmission line estimation unit 403, an update processing unit 404, and a path tracing determination unit 405.

The input end of the adaptive filter unit 401a is connected to the output end of the adaptive filter unit 301 of the provisional determination unit 30. More specifically, as illustrated in FIG. 11, the output end of the adder 34 of the adaptive filter unit 301 and the input end of the delay unit 41 of the adaptive filter unit 401a are connected.

As described in the symbol determination device 3 according to the first embodiment, the adaptive filter unit 301 aims to approximate the reception signal sequence $\{r_t\}$ to the transmission signal sequence by adaptive equalization with an estimation inverse transfer function. As a result, noise in the high frequency region will be amplified in adaptive equalization with the estimation inverse transfer function. In the adaptive filter unit 401a of the sequence estimation unit 40a, noise in the high frequency region can be suppressed and compression processing of the pulse width can be performed by simply performing filtering processing of a small number of taps that suppress noise in the high frequency region amplified by the adaptive filter unit 301. That is, in the second embodiment, the output signal of the adaptive filter unit 301 can be utilized to improve the efficiency of the compression processing of the pulse width in the adaptive filter unit 401a.

Note that, in the second embodiment as well, similar to the first embodiment, the sequence estimation unit 40a may be configured not to include the adaptive filter unit 401a. In this case, the subtracter 54 of the sequence estimation algorithm processing unit 402 takes in the output value of the adaptive filter unit 301 instead of the output value of the adaptive filter unit 401a.

Other Configuration Examples Using BCJR Algorithm

The neighbor addition comparison selection unit 51 included in the symbol determination device 3, 3a according to the first and second embodiments described above performs the Viterbi algorithm as an estimation algorithm for estimating the transmission symbol sequence, but the configuration of the present invention is not limited to the embodiments described above. For example, the neighbor addition comparison selection unit 51 may perform a BCJR algorithm, which is a Maximum A Posteriori probability (MAP) decoding method that is effective in a case where a different prior probability exists for each symbol. Note that the maximum likelihood decoding method by the Viterbi algorithm is an equivalent technique to the case where the prior probability is assumed to be an equal probability at all symbols in the MAP decoding method.

In a Low Density Parity Check (LDPC) symbol BCJR algorithm, a trellis diagram is used, similarly to the Viterbi algorithm of the MLSE. Thus, in a case of using the BCJR algorithm, it is not necessary to change the configuration of the symbol determination device 3, 3a. The algorithm performed by the neighbor addition comparison selection unit 51 can be replaced with the BCJR algorithm from the Viterbi algorithm to estimate the transmission symbol sequence using the BCJR algorithm.

The neighbor addition comparison selection unit 51 performs the BCJR algorithm in the range of the provisional determination symbols provisionally determined by the provisional determination unit 30 and the nearby symbols centered on each of the provisional determination symbols. At this time, the conditional probability of either the value "0" or "1" of the binary value representing the symbol may be 0%. The BCJR algorithm has the problem that the log-likelihood ratio is the soft determination output and the log-likelihood ratio becomes infinity when the conditional probability becomes 0%.

Figure 12:
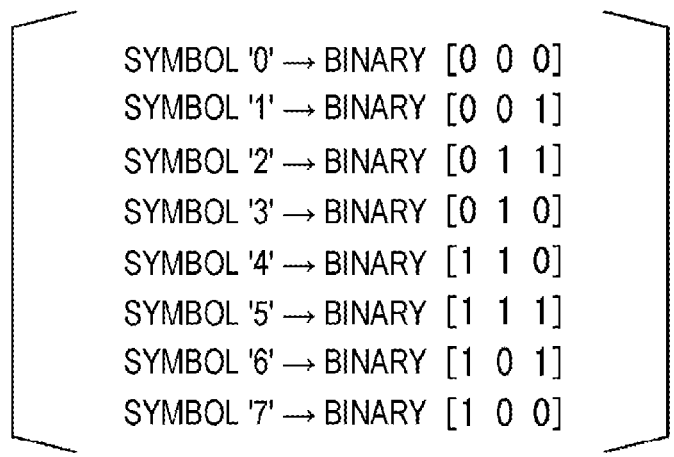
FIG. 12 is a diagram illustrating an example of a gray code in a case where the symbol multi-level degree is 8.

The problem of this BCJR algorithm is described by using specific examples. FIG. 12 is a diagram illustrating the gray code in the case of the symbol multi-level degree m=8. In the gray code, in a case where the determination is mistakenly determined as an adjacent symbol, the symbol minimizes errors in the binary value. For example, in a case where the symbol is determined to be "2" when it should be determined to be "3", the binary value represents the same "01" in the first value and the second value, so that mistakes in the binary value can be suppressed to only the third value.

Figure 13:
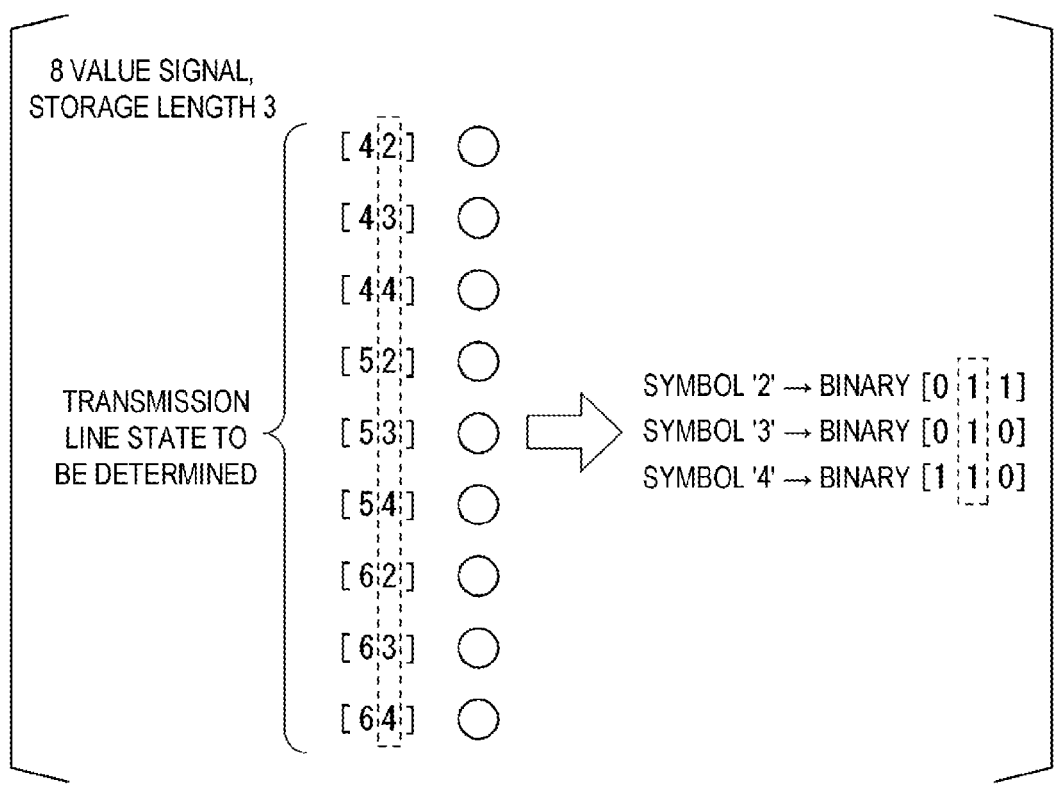
FIG. 13 is a diagram illustrating the problems in a case of applying the BCJR algorithm.
Figure 15:
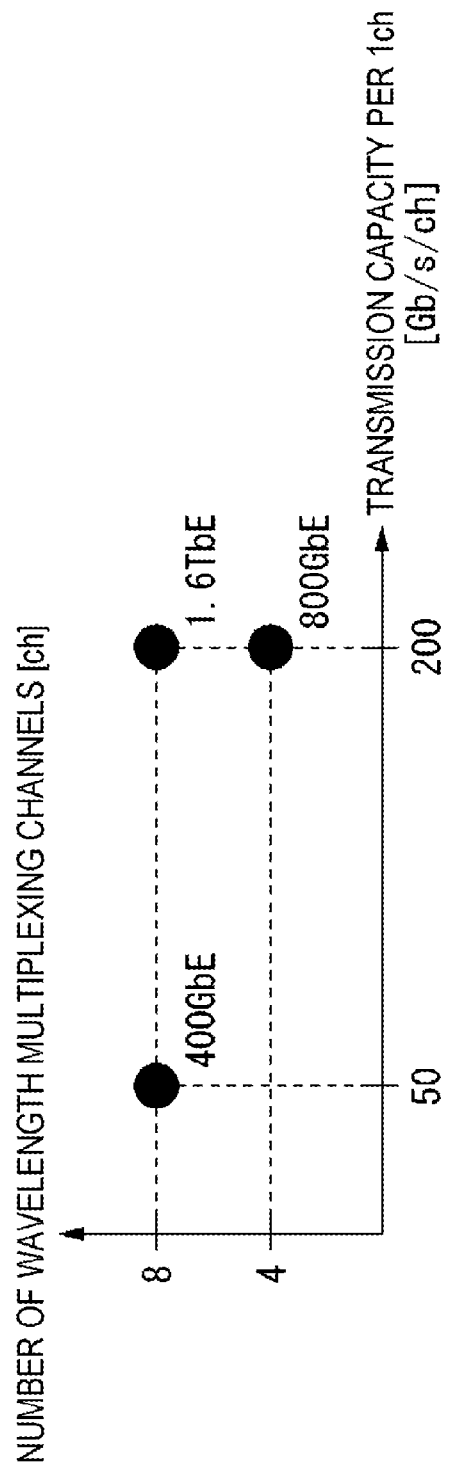
FIG. 15 is a graph illustrating the relationship between transmission capacity and multiplicity of wavelength.
Figure 16:
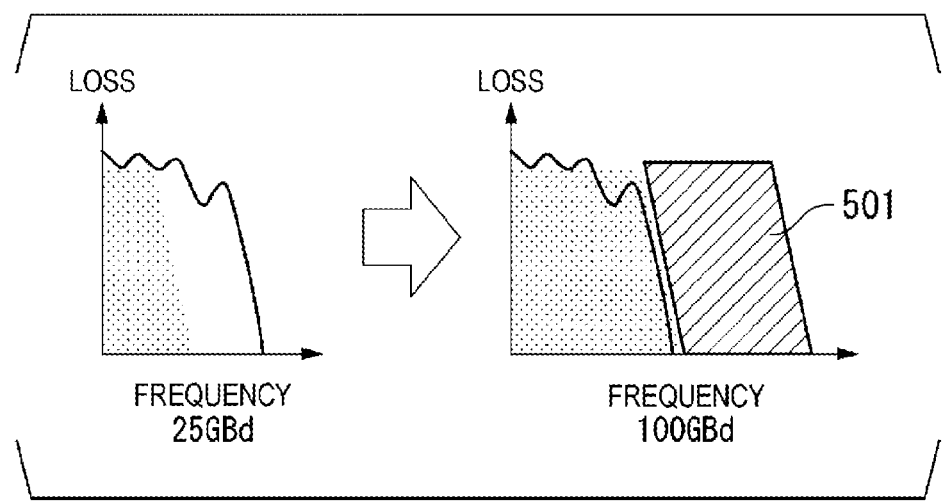
FIG. 16 is a graph illustrating the impact of device band restrictions in a case where transmission capacity is increased.
Figure 17:
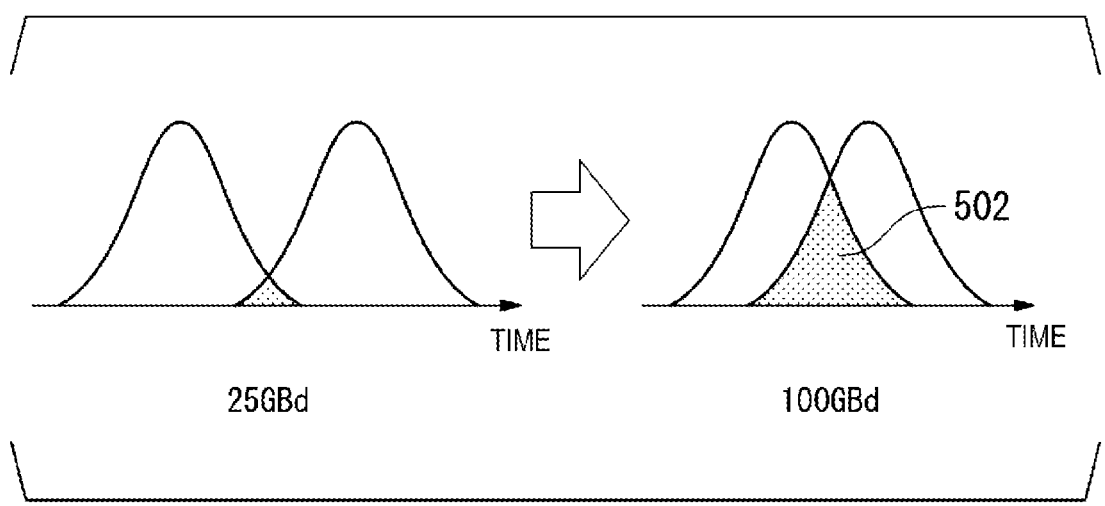
FIG. 17 is a graph illustrating the impact of wavelength dispersion in a case where transmission capacity is increased.

For example, in the case of the storage length "3", it is assumed that there are nine states illustrated in FIG. 13 as the transmission line states of the computation targets of the BCJR algorithm. In this case, for the symbols "2", "3", and "4", the binary value at the second place is always "1", so the conditional probability that the binary value at the second place is "1" is 100%, and the conditional probability of being "0" is 0%. In this case, calculating the log-likelihood ratio R results in infinity as illustrated in the following Equation (14).

[Math. 14]

$$R = \log\frac{P(u=1)}{p(u=0)} = \log\frac{1}{0} = \infty \qquad (14)$$

Note than, in Equation (14), P (u=1) is a probability of being "1", and P (u=0) is a probability of being "0". This problem can be solved if the log-likelihood ratio R can indicate a value that is not infinity but is close to infinity. Thus, in a case where the log-likelihood ratio R is infinity, a technique of applying a sufficiently large predetermined value as the log-likelihood ratio R is considered. For example, in a case where P (u=1)=0.999999, the log-likelihood ratio R is R≈6, so a value of approximately R=10 is applied. Note that "0" and "1" of the binary values are merely differences of description, and the same applies to a case where "0" and "1" are inversed.

Because the conditional probability of the binary value depends on the provisional determination symbols and the nearby symbols, when the neighbor addition comparison selection unit 51 receives the provisional determination symbols from the provisional determination unit 30, the position of the binary value by which the log-likelihood ratio R becomes infinity can be identified.

Thus, a table, for example as illustrated in FIG. 14 is stored in advance in the storage area inside the neighbor addition comparison selection unit 51. The table illustrated in FIG. 14 includes items for "provisional determination symbol value", "target symbol value", and "binary value position". The "provisional determination symbol value" is written with a value of 0 to 7 indicating a provisional determination symbol. The "target symbol sequence" is written with a symbol sequence including nearby symbols in the case of the storage length "3".

The "binary value position" is written with information indicating a position where a conditional probability of a binary value of either "0" or "1" becomes 0% is written. For example, in a case where the provisional determination symbol is "3", that is, in a case of a sequence of "2", "3", and "4", the conditional probability that the second binary value becomes "0" is 0%. In contrast, in a case where the provisional determination symbol is "1", that is, in a case of a sequence of "0," "1," and "2," the conditional probability that the first binary value becomes "1" is 0%.

By including such a table, when the neighbor addition comparison selection unit 51 receives the provisional determination symbol from the provisional determination unit 30, it is possible to identify the position of the binary value by which the log-likelihood ratio R becomes infinity. Then, for the identified position, the calculation is performed by using a predetermined sufficiently large value, for example, a value of approximately "10", as the log-likelihood ratio R. In this way, the neighbor addition comparison selection unit 51 can perform the computation of the BCJR algorithm without matter.

Note that in the configuration of the first and second embodiments described above, a linear transversal filter is applied to the adaptive filter unit 301, the adaptive filter unit 401, 401a, the transmission line estimation unit 403, and the filter update transmission line estimation unit 70, but the configuration of the present invention is not limited to the embodiments described above. Filters other than the linear transversal filter, such as other linear filters or non-linear filters, may be applied to the adaptive filter unit 301, the adaptive filter unit 401, 401a, the transmission line estimation unit 403, and the filter update transmission line estimation unit 70.

In the configuration of the first and second embodiments described above, the filter update algorithm processing unit 35, 75 calculates the update values of the filter coefficient values such as the tap gain values $f_1$ to $f_u$, the tap gain values $c_1$ to $c_v$, and the coefficient values $h_1$ to $h_x$ so as to reduce errors by a predetermined update algorithm. Here, as a predetermined update algorithm, an iterative approximation solution algorithm such as, for example, the Least Mean Square (LMS) algorithm or the Recursive Least Square (RLS) algorithm may be applied.

In a case where the LMS algorithm is applied, the update values of the filter coefficient values set to each tap is calculated, for example, by the following Equation (15).

$$H(n)_{k+1}=H(n)_k+\varphi^*E^*U(n)_k \quad (15)$$

In Equation (15), n is an identifier of a plurality of taps, and k is a value indicating the number of updates. $H(n)_{k+1}$ is the update value of the filter coefficient value, $H(n)_k$ is the filter coefficient value before updating, and $U(n)_k$ is the input signal provided to the n-th tap right before calculating the update value. E is an error, and $\varphi$ is a convergent constant defined as appropriate. Each time the filter update algorithm processing unit 35, 75 calculates a new filter coefficient value, the filter update algorithm processing unit 35, 75, for example, writes the calculated filter coefficient value in the storage area inside, and reads it from the storage area inside for next updating to use it as the filter coefficient value $H(n)_k$ before updating.

The symbol determination device 3, 3a in the above-described embodiments may be achieved by a computer. In such a case, it may be implemented by recording a program for implementing these functions in a computer-readable recording medium, causing a computer system to read the program recorded in the recording medium, and executing the program. Note that the "computer system" as used herein includes an OS and hardware such as a peripheral device. The "computer-readable recording medium" refers to a portable medium such as a flexible disk, a magneto-optical disk, a ROM, and a CD-ROM, and a storage apparatus such as a hard disk installed in a computer system. Further, the "computer-readable recording medium" may also include such a medium that stores programs dynamically for a short period of time, one example of which is a communication line used when a program is transmitted via a network such as the Internet and a communication line such as a telephone line, and may also include such a medium that stores programs for a certain period of time, one example of which is a volatile memory inside a computer system that functions as a server or a client in the above-described case. The above program may be a program for implementing a part of the above-mentioned functions. The above program may be a program capable of implementing the above-mentioned functions in combination with another program already recorded in a computer system. The above program may be a program to be implemented with the use of a programmable logic device such as a field programmable gate array (FPGA).

The embodiments of the present invention have been described above in detail with reference to the drawings. However, specific configurations are not limited to those embodiments, and include any design or the like within the scope not departing from the gist of the present invention.

REFERENCE SIGNS LIST

3 Symbol determination device
30 Provisional determination unit
40 Sequence estimation unit
301 Adaptive filter unit
302 Determination processing unit
303 Update processing unit
401 Adaptive filter unit
402 Sequence estimation algorithm processing unit
403 Transmission line estimation unit
404 Update processing unit
405 Path tracing determination unit

The invention claimed is:

1. A symbol determination device comprising:
a provisional determiner configured to generate a symbol sequence by performing adaptive equalization by an estimation inverse transfer function of a transmission line on a reception signal sequence extracted from the transmission line, and perform provisional determination on the symbol sequence;

a transmission estimator configured to generate, based on a plurality of the symbol sequences indicating transmission line states and an estimation transfer function of the transmission line, an estimation reception symbol sequence for each of the transmission line states;

a sequence estimation algorithm processor configured to calculate a metric between the symbol sequence obtained from the reception signal sequence and each of a plurality of the estimation reception symbol sequences, and select a most likelihood estimation reception symbol sequence of the plurality of the estimation reception symbol sequences by a predetermined algorithm, based on the calculated metric, a provisional determination symbol provisionally determined by the provisional determiner, and nearby symbols of the provisional determination symbol; and a path tracing determiner configured to determine a transmission symbol sequence by tracing back paths of trellis, based on the most likelihood estimation reception symbol sequence, wherein the sequence estimation algorithm processor generates a plurality of the symbol sequences indicating the transmission line states in a range of the provisional determination symbol and the nearby symbols of the provisional determination symbol to output the plurality of the symbol sequences to the transmission line estimator, wherein each of the provisional determiner, the transmission line estimator, the sequence estimation algorithm processor, and the path tracing determiner is implemented by:

i) computer executable instructions executed by at least one processor, ii) at least one circuitry or iii) a combination of computer executable instructions executed by at least one processor and at least one circuitry.

2. The symbol determination device according to claim 1, wherein the nearby symbols are symbols before and after the provisional determination symbol, and a sum of the number of the provisional determination symbol and the number of the nearby symbols is (2n+1) wherein n is an integer of 2 or greater.

3. The symbol determination device according to claim 1, wherein the symbol sequence obtained from the reception signal sequence is any of a symbol sequence included in the reception signal sequence, a symbol sequence generated by the provisional determiner performing adaptive equalization on a part of the reception signal sequence by the estimation inverse transfer function, or a symbol sequence generated by an adaptive filter further included, and the adaptive filter generates the symbol sequence by performing filtering processing that compresses a pulse width on a part of an input signal sequence, and is provided with the reception signal sequence or a signal sequence including a symbol sequence generated by the provisional determiner performing the adaptive equalization on the part of the reception signal sequence by the estimation inverse transfer function of the transmission line, as the input signal sequence.

4. The symbol determination device according to claim 1, comprising:

an update processor configured to calculate the estimation transfer function, based on the symbol sequence output by the path tracing determiner and the symbol sequence obtained from the reception signal sequence, wherein the update processor is implemented by:

i) computer executable instructions executed by at least one processor, ii) at least one circuitry or iii) a combination of computer executable instructions executed by at least one processor and at least one circuitry.

5. The symbol determination device according to claim 3, further comprising:

an update processor configured to calculate, based on the symbol sequence output by the path tracing determiner and the symbol sequence obtained from the reception signal sequence, the estimation transfer function and a filter coefficient value of the filtering processing performed by the adaptive filter, in a case where the adaptive filter is provided, wherein the update processor is implemented by:

i) computer executable instructions executed by at least one processor, ii) at least one circuitry or iii) a combination of computer executable instructions executed by at least one processor and at least one circuitry.

6. The symbol determination device according to claim 1, wherein the predetermined estimation algorithm is a Viterbi algorithm or a Bahl-Cocke-Jelinek-Raviv (BCJR) algorithm, and in a case where the BCJR algorithm is applied, the sequence estimation algorithm processor uses a finite value defined in advance as a log-likelihood ratio of a binary value in a case where the log-likelihood ratio of the binary value included in the symbol sequence including the provisional determination symbol and the nearby symbols of the provisional determination symbol is infinity.

7. The symbol determination device according to claim 1, wherein the provisional determiner calculates the estimation inverse transfer function, based on the symbol sequence generated by performing the adaptive equalization by the inverse transfer function of the transmission line and the symbol sequence obtained as a determination result of the provisional determination.

8. A symbol determination method comprising:

generating a symbol sequence by performing adaptive equalization by an estimation inverse transfer function of a transmission line on a reception signal sequence extracted from the transmission line, and performing provisional determination on the symbol sequence;

generating a plurality of the symbol sequences indicating transmission line states in a range of a provisional determination symbol provisionally determined and nearby symbols of the provisional determination symbol;

generating, based on the plurality of the symbol sequences generated and an estimation transfer function of the transmission line, an estimation reception symbol sequence for each of the transmission line states;

calculating a metric between the symbol sequence obtained from the reception signal sequence and each of a plurality of the estimation reception symbol sequences;

selecting a most likelihood estimation reception symbol sequence of the plurality of the estimation reception symbol sequences by a predetermined algorithm, based on the calculated metric, the provisional determination symbol, and the nearby symbols of the provisional determination symbol; and determining a transmission symbol sequence by tracing back paths of trellis, based on the most likelihood estimation reception symbol sequence.

\* \* \* \* \*